United States Patent
Lyon et al.

(10) Patent No.: US 6,998,660 B2
(45) Date of Patent: Feb. 14, 2006

(54) VERTICAL COLOR FILTER SENSOR GROUP ARRAY THAT EMULATES A PATTERN OF SINGLE-LAYER SENSORS WITH EFFICIENT USE OF EACH SENSOR GROUP'S SENSORS

(75) Inventors: Richard F. Lyon, Los Altos, CA (US); Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 133 days.

(21) Appl. No.: 10/738,484

(22) Filed: Dec. 17, 2003

(65) Prior Publication Data

US 2004/0178467 A1    Sep. 16, 2004

Related U.S. Application Data

(63) Continuation-in-part of application No. 10/355,723, filed on Jan. 31, 2003, which is a continuation-in-part of application No. 10/103,304, filed on Mar. 20, 2002, now Pat. No. 6,864,557.

(51) Int. Cl.
*H01L 31/00* (2006.01)

(52) U.S. Cl. .................. 257/294; 257/440; 257/443

(58) Field of Classification Search ........ 348/272–274, 348/280, 281; 257/290–294, 443, 432, 440, 257/444
See application file for complete search history.

(56) References Cited

U.S. PATENT DOCUMENTS

| | | | |
|---|---|---|---|
| 3,617,753 A | 11/1971 | Kato et al. | 250/211 J |
| 3,971,065 A | 7/1976 | Bayer | 358/41 |
| 4,011,016 A | 3/1977 | Layne et al. | 356/195 |
| 4,238,760 A | 12/1980 | Carr | 357/30 |
| 4,309,604 A | 1/1982 | Yoshikawa et al. | 250/226 |
| 4,581,625 A | 4/1986 | Gay et al. | 357/30 |
| 4,613,895 A | 9/1986 | Burkey et al. | 358/41 |
| 4,651,001 A | 3/1987 | Harada et al. | 250/330 |
| 4,677,289 A | 6/1987 | Nozaki et al. | 250/226 |
| 4,772,957 A | 9/1988 | Nakagawa et al. | 358/280 |
| 5,397,734 A | 3/1995 | Iguchi et al. | 437/70 |
| 5,502,299 A | 3/1996 | Standley | 250/208.2 |
| 5,668,596 A | 9/1997 | Vogel | 348/222 |
| 5,739,562 A | 4/1998 | Ackland et al. | 257/291 |
| 5,872,371 A | 2/1999 | Guidash et al. | 257/230 |

(Continued)

FOREIGN PATENT DOCUMENTS

EP    0 605 898 A1    12/1993

(Continued)

OTHER PUBLICATIONS

I. Takayanagi, et al., *"A Low Dark Current Stacked CMOS-APS for Charged Particle Imaging"*, IEDM Technical Digest, Washington, D.C., Dec. 2-5, 2001, pp. 551-554.

(Continued)

*Primary Examiner*—Minh-Loan Tran
(74) *Attorney, Agent, or Firm*—Girard & Equitz LLP

(57) ABSTRACT

An array of vertical color filter (VCF) sensor groups, each VCF sensor group including at least two vertically stacked, photosensitive sensors. Preferably, the array is fabricated, or the readout circuitry is configured (or has a state in which it is configured), to combine the outputs of sensors of multiple sensor groups such that the array emulates a conventional array of single-layer sensors arranged in a Bayer pattern or other single-layer sensor pattern, and such that the outputs of at least substantially all of the sensors of each of the VCF sensor groups are utilized to emulate the array of single-layer sensors.

43 Claims, 28 Drawing Sheets

U.S. PATENT DOCUMENTS

| | | | |
|---|---|---|---|
| 5,883,421 A | 3/1999 | Ben Chouikha et al. | 257/461 |
| 5,889,315 A | 3/1999 | Farrenkopf et al. | 257/552 |
| 5,899,714 A | 5/1999 | Farrenkopf et al. | 438/202 |
| 5,965,875 A | 10/1999 | Merrill | 250/226 |
| 6,078,037 A | 6/2000 | Booth, Jr. | 250/208.1 |
| 6,111,300 A | 8/2000 | Cao et al. | 257/440 |
| 6,452,632 B1 * | 9/2002 | Umeda et al. | 348/294 |
| 6,455,833 B1 | 9/2002 | Berezin | 250/208.1 |
| 6,593,558 B1 | 7/2003 | Edgar | 250/208.1 |
| 6,657,755 B1 * | 12/2003 | Campbell | 358/514 |
| 6,753,585 B1 | 6/2004 | Kindt | 257/440 |
| 2002/0058353 A1 | 5/2002 | Merrill | |
| 2002/0130957 A1 | 9/2002 | Gallagher et al. | |

FOREIGN PATENT DOCUMENTS

| | | |
|---|---|---|
| JP | 61-187282 | 8/1986 |
| JP | 1-34966 | 5/1989 |
| WO | WO 98/19455 | 5/1998 |
| WO | WO 01/63914 A1 | 8/2001 |

OTHER PUBLICATIONS

M. Bartek, et al., "An Integrated Silicon Colour Sensor Using Selective Epitaxial Growth", *Sensors and Actuators A: Physical*, 41-42 (1994), pp. 123-128.

P. Catrysse et al., "An Integrated Color Pixel in 0.18 μm CMOS Technology", *2001 IEDM Technical Digest*, pp. 24.4.1-24.4.4.

D. Knipp, et al., "Low Cost Approach to Realize Novel Detectors for Color Recognition", *International Congress on Imaging Science*, Sep. 7-11, 1998, Antwerp, Belgium, pp. 350-353.

D. Pasquariello, et al., "Plasma-Assisted INP-to-Si Low Temperature Wafer Bonding", *IEEE Journal on Selected Topics in Quantum Electronics*, vol. 8, No. 1. Jan./Feb. 2002, pp. 118-131.

Sony, Inc., "*Third Generation Diagonal 4.5 mm (Type 1 / 4) 250K/380K-pixel Color CCD Image Sensor, 250K/290K Pixels, ICX226AK (NTSC), ICX227AK (PAL), 380K/440K Pixels, ICX228AK (NTSC), ICX220AK (PAL)*", 2 pages, downloaded from the Internet on Nov. 18, 2002 from http://www.sony.net/products/sc-hp/cxpal/cxnews-20/pdf/n.1cx226.pdf.

Shellcase LTD., "*ShellOP*", 2 pages, downloaded from the Internet on Nov. 1, 2002 from http://www.shellcase.com/pages/products.asp.

K.M. Findlater, et al., "A CMOS Image Sensor Employing a Double Junction Photodiode", *2001 IEEE Workshop on Charge-Coupled Devices and Advanced Image Sensors, IEEE Electron Devices Society (2001)*, pp. 60-63.

Hiroki Miura, et al., "A 100 Frame/s CMOS Active Pixel Sensor for 3D Gesture Recognition System", *1999 IEEE International Solid-State Circuits Conference*, pp. 142-143.

M. Ben Chouikha, et al., "Burried Triple p-n Junction Structure in a BiCMOS Technology for Color Detection", *1997 IEEE BCTM 6.4*, pp. 108-111.

Nayar, S.K. and Mitsunaga, T., "High Dynamic Range Imaging: Spatially Varying Pixel Exposures," *Proceedings of the IEEE Conference on Computer Vision and Pattern Recognition*, vol. I, pp. 472-479, Jun. 2000.

R.M. Guidash, et al., "A 0.6 μm CMOS Pinned Photodiode Color Imager Technology", *1997 IEDM Tech. Digest*, pp. 927-929.

Chamberlain, S.G., "Photosensitivity and Scanning of Silicon Image Detector Arrays", *IEEE Journal of Solid State Circuits*, vol. SC-4, No. 6, Dec. 1969, pp. 333-342.

M. Ben Chouikha, et al., "Color Sensitive Photodetectors in Standard CMOS and BiCMOS Technologies", *Advanced Focal Plane Arrays and Electronic Cameras proceedings*, Oct. 9-10, 1996, Berlin, Germany *SPIE Proceeding Series*, vol. 2950, pp. 108-120.

Kramer, J., "Photo-ASICS: Integrated Optical Metrology Systems with Industrial CMOS Technology", *Paul Scherrer Institute Zurich (PSIZ)*, 1993, pp. 4-91.

* cited by examiner

| RGB⨯ | RGB⨯ | RGB | RGB | RGB⨯ | RGB⨯ | RGB | RGB |
|---|---|---|---|---|---|---|---|
| RGB | RGB | RGB⨯ | RGB⨯ | RGB | RGB | RGB⨯ | RGB⨯ |
| RGB⨯ | RGB⨯ | RGB | RGB | RGB⨯ | RGB⨯ | RGB | RGB |
| RGB | RGB | RGB⨯ | RGB⨯ | RGB | RGB | RGB⨯ | RGB⨯ |
| RGB⨯ | RGB⨯ | RGB | RGB | RGB⨯ | RGB⨯ | RGB | RGB |
| RGB | RGB | RGB⨯ | RGB⨯ | RGB | RGB | RGB⨯ | RGB⨯ |

FIG. 8E

| RGB | RGB⨯ | RGB | RGB | RGB⨯ | RGB | RGB | RGB⨯ |
|---|---|---|---|---|---|---|---|
| RGB⨯ | RGB | RGB⨯ | RGB⨯ | RGB | RGB⨯ | RGB⨯ | RGB |
| RGB | RGB⨯ | RGB | RGB | RGB⨯ | RGB | RGB | RGB⨯ |
| RGB | RGB⨯ | RGB | RGB | RGB⨯ | RGB | RGB | RGB⨯ |
| RGB⨯ | RGB | RGB⨯ | RGB⨯ | RGB | RGB⨯ | RGB⨯ | RGB |
| RGB | RGB⨯ | RGB | RGB | RGB⨯ | RGB | RGB | RGB⨯ |

FIG. 8F

| B/G | R/G | B/G ✕ | R/G ✕ | B/G | R/G | B/G ✕ | R/G ✕ |
|---|---|---|---|---|---|---|---|
| R/G ✕ | B/G ✕ | R/G | B/G | R/G ✕ | B/G ✕ | R/G | B/G |
| B/G | R/G | B/G ✕ | R/G ✕ | B/G | R/G | B/G ✕ | R/G ✕ |
| R/G ✕ | B/G ✕ | R/G | B/G | R/G ✕ | B/G ✕ | R/G | B/G |
| B/G | R/G | B/G ✕ | R/G ✕ | B/G | R/G | B/G ✕ | R/G ✕ |
| R/G ✕ | B/G ✕ | R/G | B/G | R/G ✕ | B/G ✕ | R/G | B/G |

FIG. 11A

| R/G ✕ | B/G ✕ | R/G | B/G | R/G ✕ | B/G ✕ | R/G | B/G |
|---|---|---|---|---|---|---|---|
| B/G | R/G | B/G ✕ | R/G ✕ | B/G | R/G | B/G ✕ | R/G ✕ |
| R/G ✕ | B/G ✕ | R/G | B/G | R/G ✕ | B/G ✕ | R/G | B/G |
| B/G | R/G | B/G ✕ | R/G ✕ | B/G | R/G | B/G ✕ | R/G ✕ |
| R/G ✕ | B/G ✕ | R/G | B/G | R/G ✕ | B/G ✕ | R/G | B/G |
| B/G | R/G | B/G ✕ | R/G ✕ | B/G | R/G | B/G ✕ | R/G ✕ |

FIG. 11B

| B/G ✗ | R/G ✗ | B/G | R/G | B/G ✗ | R/G ✗ | B/G | R/G |
|---|---|---|---|---|---|---|---|
| R/G ✗ | B/G ✗ | R/G | B/G | R/G ✗ | B/G ✗ | R/G | B/G |
| B/G | R/G | B/G ✗ | R/G ✗ | B/G | R/G | B/G ✗ | R/G ✗ |
| R/G | B/G | R/G ✗ | B/G ✗ | R/G | B/G | R/G ✗ | B/G ✗ |
| B/G ✗ | R/G ✗ | B/G | R/G | B/G ✗ | R/G ✗ | B/G | R/G |
| R/G ✗ | B/G ✗ | R/G | B/G | R/G ✗ | B/G ✗ | R/G | B/G |

FIG. 11C

| R/G ✗ | B/G ✗ | R/G | B/G | R/G ✗ | B/G ✗ | R/G | B/G |
|---|---|---|---|---|---|---|---|
| B/G ✗ | R/G ✗ | B/G | R/G | B/G ✗ | R/G ✗ | B/G | R/G |
| R/G | B/G | R/G ✗ | B/G ✗ | R/G | B/G | R/G ✗ | B/G ✗ |
| B/G | R/G | B/G ✗ | R/G ✗ | B/G | R/G | B/G ✗ | R/G ✗ |
| R/G ✗ | B/G ✗ | R/G | B/G | R/G ✗ | B/G ✗ | R/G | B/G |
| B/G ✗ | R/G ✗ | B/G | R/G | B/G ✗ | R/G ✗ | B/G | R/G |

FIG. 11D

| BG | RG | BG | RG | BG | RG | BG | RG |
|----|----|----|----|----|----|----|----|
| RG | BG | RG | BG | RG | BG | RG | BG |
| BG | RG | BG | RG | BG | RG | BG | RG |
| RG | BG | RG | BG | RG | BG | RG | BG |
| BG | RG | BG | RG | BG | RG | BG | RG |
| RG | BG | RG | BG | RG | BG | RG | BG |

FIG. 14A

| RG | BG | RG | BG | RG | BG | RG | BG |
|----|----|----|----|----|----|----|----|
| BG | RG | BG | RG | BG | RG | BG | RG |
| RG | BG | RG | BG | RG | BG | RG | BG |
| BG | RG | BG | RG | BG | RG | BG | RG |
| RG | BG | RG | BG | RG | BG | RG | BG |
| BG | RG | BG | RG | BG | RG | BG | RG |

FIG. 14B

VERTICAL COLOR FILTER SENSOR GROUP ARRAY THAT EMULATES A PATTERN OF SINGLE-LAYER SENSORS WITH EFFICIENT USE OF EACH SENSOR GROUP'S SENSORS

RELATED APPLICATIONS

This application is a continuation in part of U.S. patent application Ser. No. 10/355,723, filed Jan. 31, 2003, entitled VERTICAL COLOR FILTER SENSOR GROUP WITH CARRIER-COLLECTION ELEMENTS OF DIFFERENT SIZE AND METHOD FOR FABRICATING SUCH A SENSOR GROUP, and a continuation in part of U.S. patent application Ser. No. 10/103,304, entitled VERTICAL COLOR FILTER DETECTOR GROUP AND ARRAY, filed on Mar. 20, 2002, and issued as U.S. Pat. No. 6,864,557 on Mar. 8, 2005.

BACKGROUND OF THE INVENTION

1. Field of the Invention

The present invention relates to arrays of photosensitive sensor groups, each sensor group comprising vertically stacked sensors, and each sensor group positioned at a different pixel location. In each sensor group, semiconductor material chromatically filters incident electromagnetic radiation vertically (optionally, other material also filters the radiation) and each sensor simultaneously detects a different wavelength band.

2. Background of the Invention

The term "radiation" is used herein to denote electromagnetic radiation.

The expression "top sensor" (of a sensor group) herein denotes the sensor of the group that radiation, incident at the sensor group, reaches before reaching any other sensor of the group. The expression that the sensors of a sensor group are "vertically stacked" denotes that one of the sensors is a top sensor of the group, and that the group has an axis (sometimes referred to as a "vertical axis") that extends through all the sensors. As described below, a vertical color filter ("VCF") sensor group preferably includes vertically stacked sensors configured such that the group's top sensor has a top surface that defines a normal axis (e.g., is at least substantially planar), and when radiation propagating along a vertical axis of the group is incident at the group, the radiation is incident at the top sensor with an incidence angle of less than about 30 degrees with respect to the normal axis (e.g., the radiation is normally incident at the group).

The expression used herein that two elements, included in a structure having a vertical axis, are "laterally" (or "horizontally") separated denotes that there is an axis parallel to the vertical axis that extends between the elements but intersects neither element. The expression that an item "comprises" an element is used herein (including in the claims) to denote that the item is or includes the element.

MOS active pixel sensors are known in the art. Multiple-wavelength band active pixel sensor arrays are also known in the art. One type of multiple-wavelength band active pixel sensor array employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per resolution element as these sensors are tiled together in a plane. In addition, reconstruction of a color image from such a sensor array is computationally intensive and often results in images with artifacts, defects, or inferior resolution.

Several types of vertical color filter ("VCF") sensor groups and methods for fabricating them are described in U.S. Patent Application Publication No. US 2002/0058353A1, published May 16, 2002, and in above-referenced U.S. patent application Ser. No. 10/103,304. A VCF sensor group includes at least two photosensitive sensors that are vertically stacked with respect to each other (with or without non-sensor material between adjacent sensors). Each sensor of a VCF sensor group has a different spectral response. Typically, each sensor has a spectral response that peaks at a different wavelength. In some embodiments, a VCF sensor group (or one or more of the sensors thereof) includes a filter that does not also function as a sensor.

A VCF sensor group simultaneously senses photons of at least two wavelength bands in the same area of the imaging plane. In contrast, time sequential photon sensing methods do not perform photon sensing at the same time for all wavelength bands. The sensing performed by a VCF sensor group included in an imager occurs in one area of the imager (when the imager is viewed vertically), and photons are separated by wavelength as a function of depth into the sensor group.

Typically, each sensor detects photons in a different wavelength band (e.g., one sensor detects more photons in the "blue" wavelength band than each other sensor, a second sensor detects more photons in the "green" wavelength band than each other sensor, and a third sensor detects more photons in the "red" wavelength band than each other sensor), although the sensor group typically has some "cross-talk" in the sense that multiple sensors detect photons of the same wavelength.

VCF sensor groups can be used for a variety of imaging tasks. In preferred embodiments, they are used in digital still cameras (DSC). However they can be employed in many other systems, such as linear imagers, video cameras and machine vision equipment.

A VCF sensor group uses the properties of at least one semiconductor material to detect incident photons, and also to selectively detect incident photons of different wavelengths at different depths in the group. The detection of different wavelengths is possible due to the vertical stacking of the sensor layers of the sensor group in combination with the variation of optical absorption depth with wavelength in semiconductor materials. The costs of manufacturing VCF sensor groups are substantially reduced because VCF sensor groups do not require external color filters (as are traditionally used in color image sensors) and do not require color filters that are distinct from the sensors themselves (the sensors themselves are made of semiconductor material that itself provides a filtering function). However, in some embodiments of the invention, VCF sensor groups do include (or are used with) color filters that are distinct from the sensors themselves. The spectral response characteristics of VCF color sensor groups typically are much more stable and less sensitive to external factors such as temperature or other environmental factors (that may be present during or after manufacturing) than are conventional color sensors with non-semiconductor based filters.

A VCF sensor group is preferably formed on a substrate (preferably a semiconductor substrate) and comprises a plurality of vertically stacked sensors (e.g., sensor layers) configured by doping and/or biasing to collect photo-generated carriers of a first polarity (preferably negative electrons). The sensors include (or pairs of the sensors are separated by) one or more reference layers configured to collect and conduct away photo-generated carriers of the opposite polarity (preferably positive holes). The sensors have different spectral sensitivities based on their different depths in the sensor group, and on other parameters including doping levels and biasing conditions. In operation, the sensors are individually connected to biasing and active pixel sensor readout circuitry. VCF sensor groups and methods for fabricating them are discussed more fully in above-referenced U.S. Patent Application Publication No. US 2002/0058353A1, and in the parent application, U.S. patent application Ser. No. 10/103,304.

BRIEF DESCRIPTION OF THE INVENTION

In a class of embodiments, the invention is an array of vertical color filter (VCF) sensor groups, each VCF sensor group including at least two vertically stacked, photosensitive sensors. Preferably, the array is formed on a substrate, and readout circuitry is coupled to the sensor groups. Each sensor group includes a "top" sensor, and the top sensors of all the groups together comprise a first layer of sensors. Each sensor group includes a second sensor (positioned below the group's top sensor), and the second sensors of all the groups together comprise a second layer of sensors. Optionally, each sensor group includes one or more additional sensors, so that the array includes at least three layers of sensors. In a class of typical embodiments, each sensor group includes a blue sensor, a green sensor below the blue sensor, and a red sensor below the green sensor, and the array consists of a first layer of blue sensors, a second layer of green sensors, and a third layer of red sensors.

In a class of embodiments, inventive array is fabricated, and/or the readout circuitry configured (or has a state in which it is configured), to combine the outputs of sensors of multiple VCF sensor groups (e.g., to combine the outputs of sensors within each layer of the array) such that the array emulates a conventional array of single-layer sensors arranged in a Bayer pattern or other single-layer sensor pattern, and such that the outputs of all of the sensors of each of at least substantially all of the of the VCF sensor groups are utilized to emulate the array of single-layer sensors. A Bayer pattern is described in U.S. Pat. No. 3,971,065 to Bayer, issued Jul. 20, 1976.

Herein, the expression that a first array "emulates" a second array is used to denote that the first array generates signals indicative of the same array of pixels as the second array (e.g., both arrays generate signals indicative of an N×M array of pixels, each pixel consisting of a defined set of color components). The expression "to combine the outputs of sensors" of at least two sensor groups is used in a broad sense herein to denote the action of summing, averaging, or otherwise combining of the outputs of distinct sensors (belonging to the same layer) of at least two of the sensor groups (e.g., by connecting the sensors with conductors), or the generation (or use) of the output of a single sensor that is shared by at least two of the sensor groups. The term "output" of a sensor (of a VCF sensor group) is used herein to denote a signal indicative of incident photon intensity at the sensor (for example, a signal indicative of photogenerated charge). For example, the outputs of distinct sensors (belonging to the same sensor group array layer) of different sensor groups can be "combined" by generating a signal indicative of the intensity of photons incident at any of the sensors. In preferred embodiments of the inventive array, the outputs of all of the sensors each of the VCF sensor groups of the array are utilized to emulate an array of single-layer sensors, so that none of the sensor outputs is ignored.

The expression "efficient use" (of sensors of an array of sensor groups) is used herein to denote use of the outputs of all (or a large percentage) of the sensors of the array to sense photons, so that the outputs of no more than a small percentage of the sensors are not used to sense photons. The term "utilize" is used herein as a synonym for "use."

In preferred embodiments, the inventive VCF sensor group array emulates an array of conventional single-layer sensors (e.g., an array of laterally separated green sensors, red sensors, and blue sensors) having a Bayer pattern or other pattern. The outputs of laterally offset sets of red, green, and blue sensors of the VCF sensor groups are combined. Herein, the expression that elements (e.g., sensors or sets of sensors) of a VCF sensor group array (or single-layer sensor array) are "laterally offset" (or "laterally separated") with respect to each other denotes that the array has a vertical axis (e.g., the array comprises VCF sensor groups having aligned vertical axes, and the aligned vertical axes of the individual sensor groups are parallel to the vertical axis of the array), each element has an optical center (the area-weighted center of the element's projection on a plane perpendicular to the array's vertical axis), and projections of the elements' optical centers (on a plane perpendicular to the array's vertical axis) are offset from each other.

For example, one block of an array of laterally offset, conventional, single-layer sensors arranged in a Bayer pattern consists of two green sensors, one blue sensor, and one red sensor arranged as follows: one row includes a green sensor and a red sensor, another row includes a green sensor and a blue sensor, the green sensors are diagonally offset (i.e., neither of them belongs to the same row or the same column), and the red sensor is diagonally offset from the blue sensor. One embodiment of the inventive array of VCF sensor groups emulates such a conventional array as follows: each VCF sensor group of the inventive array includes a red sensor vertically stacked with a blue sensor and a green sensor. The combined output of a first block of four red sensors (one red sensor from each VCF sensor group of a first block of VCF sensor groups that belong to two adjacent rows and two adjacent columns of the array) emulates the output of one red sensor of one block of the Bayer pattern of the conventional array, the combined output of a block of four blue sensors (one blue sensor from each VCF sensor group of a second block of VCF sensor groups that belong to two adjacent rows and two adjacent columns of the array, such rows offset from the rows of the first block, and such columns offset from the columns offset from the columns of the first block, so that the second block of VCF sensor groups is diagonally offset from the first block of VCF sensor groups) emulates the output of one blue sensor of the same block of the Bayer pattern of the conventional array, the combined output of two green sensors from diagonally offset VCF sensor groups emulate the output of one green sensor of the same block of the Bayer pattern of the conventional array, and the combined output of two green sensors from two other diagonally offset VCF sensor groups emulate the output of the other green sensor of the same block of the Bayer pattern of the conventional array. In this embodiment, the output of each sensor of each VCF sensor group of the inventive array is combined with the output of at least one other sensor of the array, and the output of each sensor of the inventive array is used to emulate the output of the conventional array having the Bayer pattern.

In some embodiments, the sensors of each VCF group of the inventive array have at least substantially the same "size" (where "size" herein denotes projected area in a plane perpendicular to a normal axis defined by the top surface of a top sensor of the group), and the sensors of all the VCF groups have at least substantially the same size. In various implementations of these embodiments, the outputs of sensors of adjacent VCF sensor groups are combined in any of a variety of different ways, for example by connecting the carrier-collection elements of the two sensors together with metal (or another conductor), or by exploiting source-drain diffusion to allow current flow from the carrier-collection element of one sensor to the carrier-collection element of the other sensor.

In other embodiments, the sensors of each VCF sensor group of the inventive array have different size, and at least one sensor of each VCF sensor group is shared with another sensor group. The outputs of the sensors of two such sensor groups are "combined" in the sense that the output of a single sensor shared by the sensor groups (the shared sensor having a carrier-collection element shared by the sensor groups) is used. This eliminates the need to connect laterally separated, distinct carrier-collection elements of distinct sensors of adjacent sensor groups to combine the outputs of such sensors. For example, in one embodiment, the blue sensors of each VCF sensor group have small size (this is typically appropriate since blue sensors are typically implemented near the top surface of a semiconductor wafer), and each set of four adjacent VCF sensor groups can share a larger red sensor (the carrier-collection element of the red sensor, which is implemented deeper in the wafer, has area roughly equal to four times the area of each blue sensor). In this example, the output of one red sensor (shared by four adjacent sensor groups) emulates the red component of one block of a Bayer pattern, and the outputs of the blue sensors of a different set of four adjacent sensor groups (diagonally offset from the sensor groups that share the red sensor) are combined to emulate the blue component of the same block of the Bayer pattern. In this example, the green sensors can have any of a variety of sizes. For example, the carrier-collection element of each green sensor can be an oblong area shared by two diagonally offset sensor groups, having size about half the size of the red sensor), or the carrier-collection element of each green sensor can have the same size as the carrier-collection element of each blue sensor. In the former case, the output of one green sensor (shared by two adjacent sensor groups) emulates one green component of the block of the Bayer pattern, and the output of another green sensor (shared by two other sensor groups) emulates the other green component of the block of the Bayer pattern. In the latter case, the combined output of two green sensors (of two adjacent sensor groups) emulates one green component of the block of the Bayer pattern, and the combined output of two other green sensors (of two other sensor groups) emulates the other green component of the block of the Bayer pattern.

It is contemplated that the outputs of some sensors of the inventive array are combined in one way, and that the outputs of other sensors of the array are combined in another way. It is also contemplated that the outputs of sensors of some embodiments of the inventive array can be combined (or not combined) in any selected one of at least two different ways (e.g., so that the array has a state in which the outputs of sensors are combined, and another state in which the outputs of sensors are not combined).

In a class of embodiments, the inventive array can be switched between at least two different states (e.g., one implementing a Bayer pattern and another implementing another color sensor pattern). For example, switching the array between different states can enable increased resolution in interpolated images by capturing two color sub-sampled images and combining them. In addition, the ability to change the state of the array simplifies integration of the array with other components of a system configured to work with a particular orientation or type of color filter array pattern. In some such embodiments, the inventive array comprises rows and columns of VCF sensor groups, at least one sensor of each sensor group is combinable with any of at least two different sets of other sensors (e.g., with no other sensors, or with sensors of three adjacent sensor groups), and readout circuitry is configured to accomplish read out with the array in any of its possible states. For example, the readout circuitry can be configured to selectively combine the outputs of individual sensors of individual sensor groups to allow the array to emulate any of at least two different color sensor patterns.

In some embodiments, the inventive array of VCF sensor groups uses color sub-sampling in at least one channel, but full sampling in at least one other channel (e.g., the outputs of individual green sensors are not combined, but the outputs of red sensors at another layer of the array are combined and the outputs of blue sensors at a third layer of the array are combined). In some embodiments, any selected one of two layer signals (each indicative of photons of a different wavelength band) can be read out from each sensor group of the inventive array. The layer signals can be output on separate column output lines, the column output lines being shared by sensor groups that lie along the same column of the array. Thus, in some such embodiments, photons in any selected one of two wavelength bands can be collected at each pixel location. For example, the red and blue wavelength bands can be sub-sampled by sensing red or blue illumination at alternate VCF sensor group locations within the array, while the green wavelength band can be sensed at every location within the array. This technique provides high resolution and reduced aliasing while still maintaining some of the benefits of reading out only two colors per pixel, the primary benefit being reduced complexity of readout circuits which leads to better yield and increased fill factor.

In variations on each disclosed embodiment of the inventive VCF sensor group array, a pattern of optical color filters is applied over the top sensors of the VCF sensor groups of the array (or between sensors at different layers of some or all of the VCF sensor groups of the array). Using only a single filter material, an array with three sensors per VCF sensor group can be augmented to detect light with 4, 5, or 6 different spectral sensitivity ranges, to yield potentially improved color accuracy. For example, the filter material can be an organic dye filter as in prior-art color image sensors, or it can be a layer integrated into the semiconductor fabrication process, such as either a layer of polysilicon to absorb short wavelengths, or a stack of alternating oxide and nitride layers to shape the spectral response by interference effects. Other interference-based dielectric filter stacks are also possible in conjunction with the inventive arrays of VCF sensor groups. While use of a single filter material permits up to six different spectral sensitivities, the present invention is in no way limited to the use of a single filter material, and sensor group arrays that employ VCF sensor groups in combination with color filters that have multiple different spectral transmission characteristics are possible and may be desirable for certain applications.

In some embodiments, in at least one of the VCF sensor groups of the inventive array, the carrier-collection element of one sensor of the group has substantially larger "size" (projected area in a plane perpendicular to a normal axis defined by the top surface of a top sensor of the group) than does each minimum-sized carrier-collection element of the group, where "minimum-sized" carrier-collection element denotes each carrier-collection element of the group whose projection on such plane has an area that is less than or equal to the projected area on such plane of each other carrier-collection element of the group. In some embodiments, each of the sensors of each of the sensor groups of an array has a carrier-collection element, and at least two of the sensor groups "share" at least one carrier-collection element, in the sense that a vertical axis of each sensor group that "shares" a carrier-collection element intersects such carrier-collection element. When readout circuitry is coupled to the sensor groups of such an array, a photogenerated carrier signal read from a shared carrier-collection element can be used to generate an output signal of each sensor group that shares the carrier-collection element. In a preferred embodiment of an array in this class, each sensor group includes a red sensor (shared with at least one other group), a blue sensor, and a green sensor. The carrier-collection element of each of red sensor has larger size than does the carrier-collection element of each blue sensor. The carrier-collection elements of the green sensors can be of any size (e.g., they can have the same size as those of the blue sensors or they can be smaller than those of the red sensors but larger than those of the blue sensors).

In some embodiments, the invention is an array of vertical color filter sensor groups, each of the sensor groups including at least three vertically stacked, photosensitive sensors, wherein sensors of the sensor groups are arranged in at least three vertically-stacked layers, and wherein the sensor groups are configured such that outputs of sensors of at least some of the sensor groups are combined such that the array emulates an array of single-layer sensors arranged in a single-layer sensor pattern, and such that the outputs of all of the sensors in at least three of the layers of each of at least substantially all of the sensor groups are utilized to emulate the array of single-layer sensors.

Optionally, each of one or more sensor groups of an array that embodies the invention includes at least one filter positioned relative to the sensors of the group such that radiation that has propagated through or reflected from the filter will propagate into at least one sensor of the group.

Another aspect of the invention is an image detector that comprises at least one array of VCF sensor groups and circuitry for converting photogenerated carriers produced in the sensors to electrical signals.

Figure 7A:
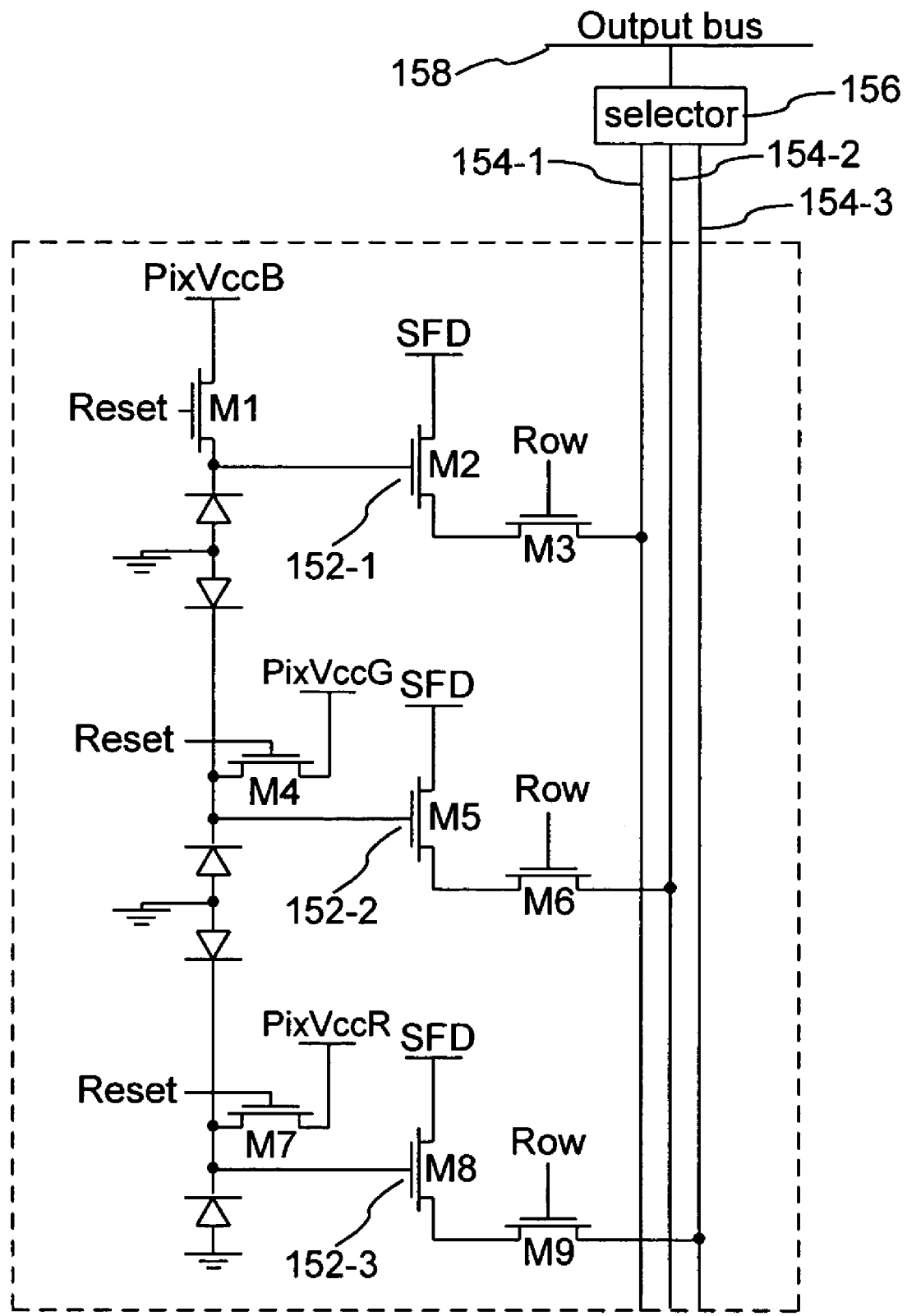
FIG. 7A is a schematic of a VCF sensor group (with readout circuitry) which is capable of being programmed to read out full measured color data or combined with the output(s) of one or more other VCF sensor groups to emulate a color filter array pattern.
Figure 7B:
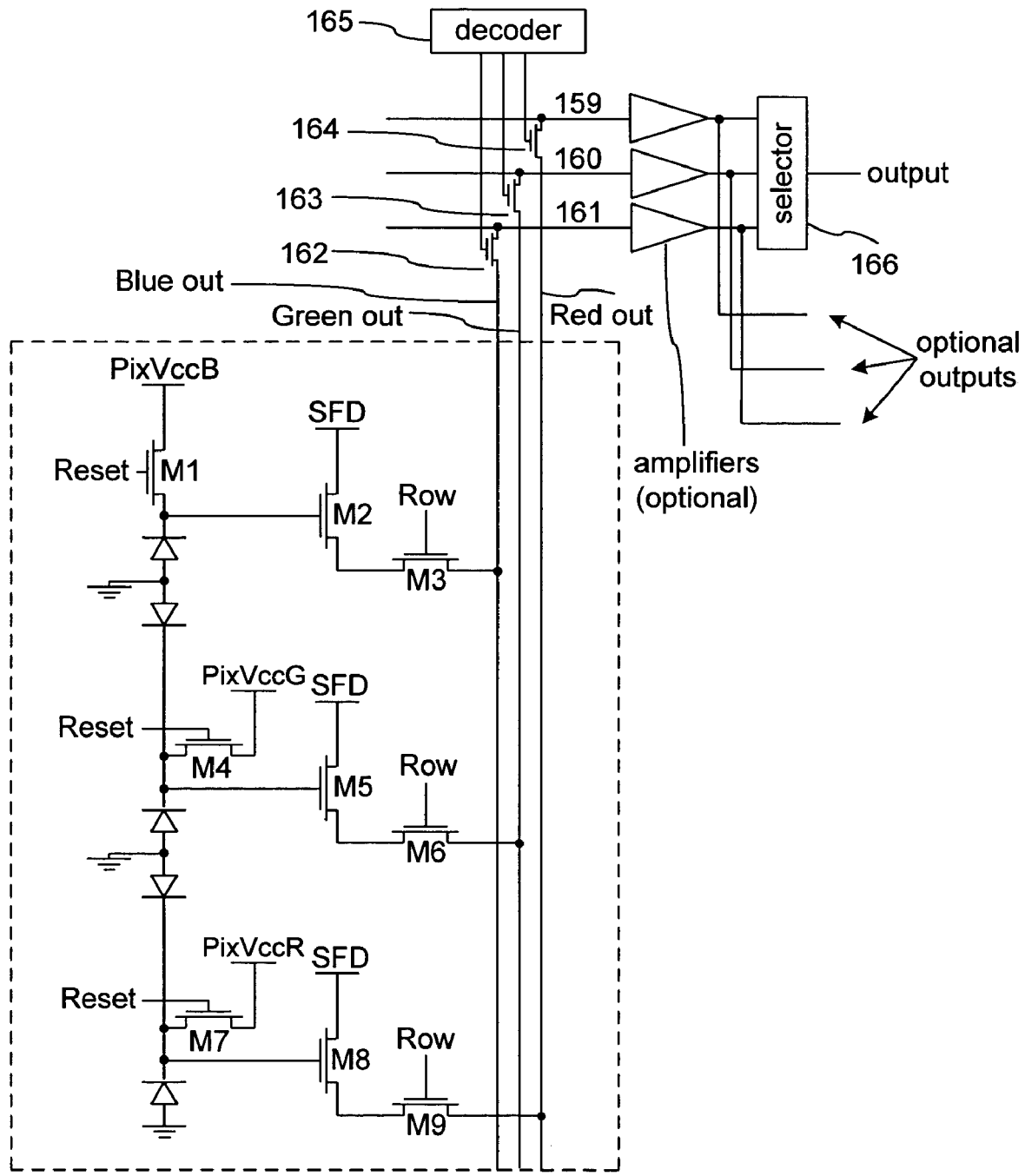
FIG. 7B is a schematic illustrating the VCF sensor group of FIG. 7A with circuitry for reading the three color outputs in parallel fashion, serial fashion, or in a mode that emulates a color filter array pattern.

Each of FIGS. 8A–8F is a schematic illustrating multiple VCF sensor groups (with readout circuitry) of the type shown in FIG. 7A or 7B in an array utilizing color filters disposed above some of the VCF sensor groups.

Figure 9:
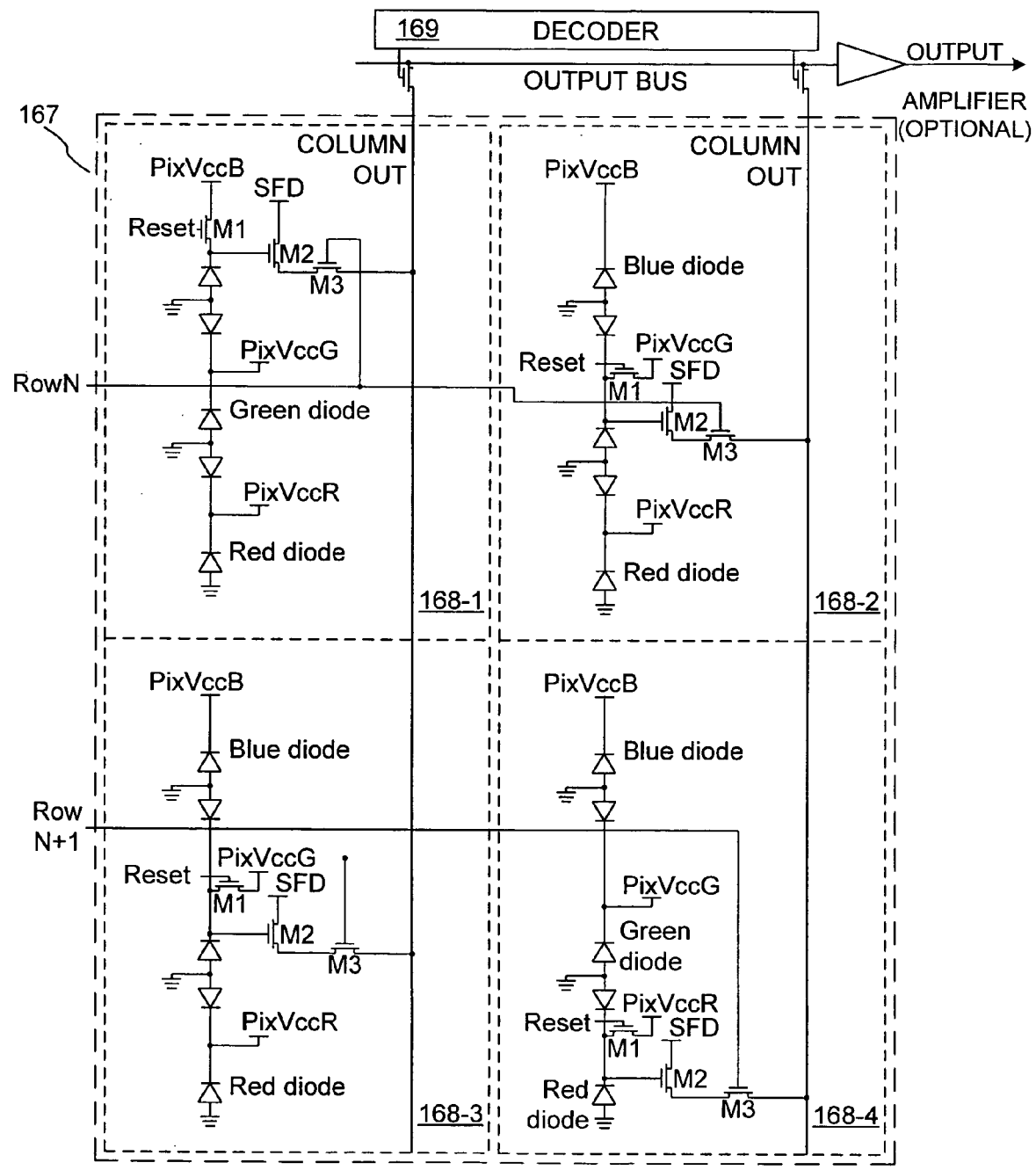

FIG. 9 is a schematic of a mosaic of VCF sensor groups configured to emulate a color filter array pattern.

Figure 10:
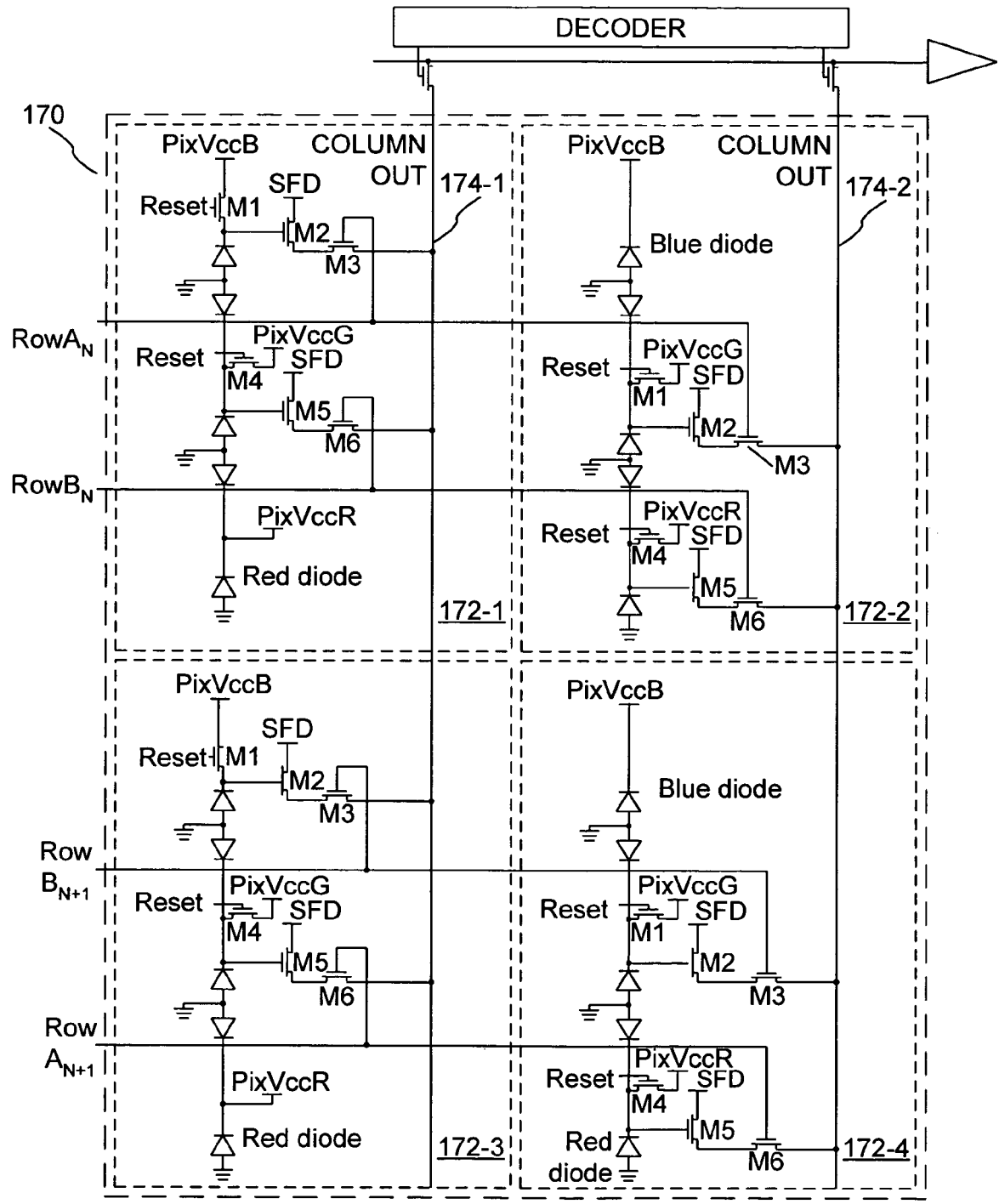

FIG. 10 is a schematic of a mosaic of VCF sensor groups that allows an emulated color filter array pattern to be shifted between two different states.

Each of FIGS. 11A, 11B, 11C, and 11D is a schematic illustrating multiple VCF sensor groups of the type shown in FIG. 10 in an array utilizing color filters disposed above some of the sensor groups.

Figure 12:
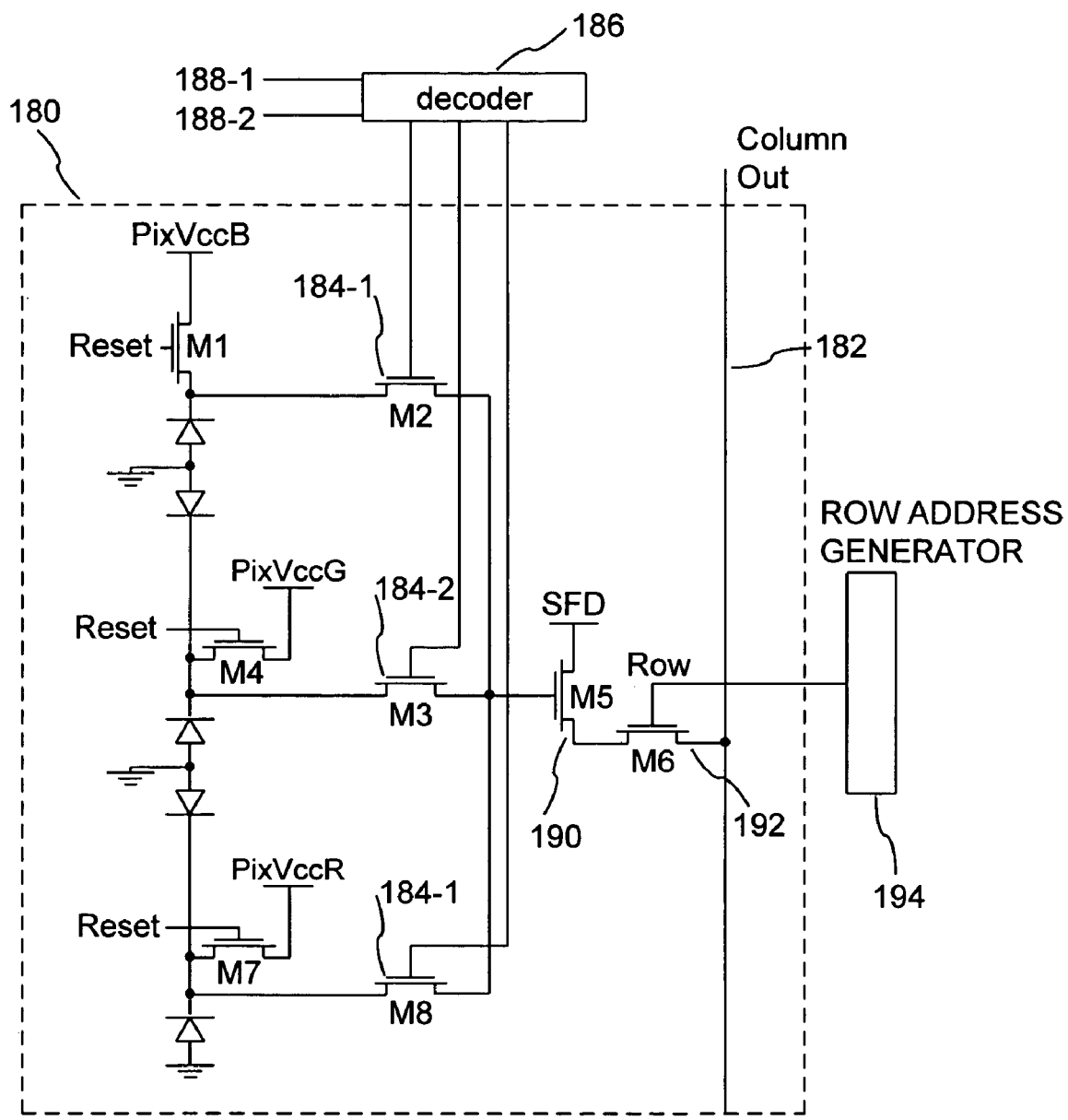

FIG. 12 is a schematic of a VCF sensor group multiplexed to a single column output line.

Figure 13:
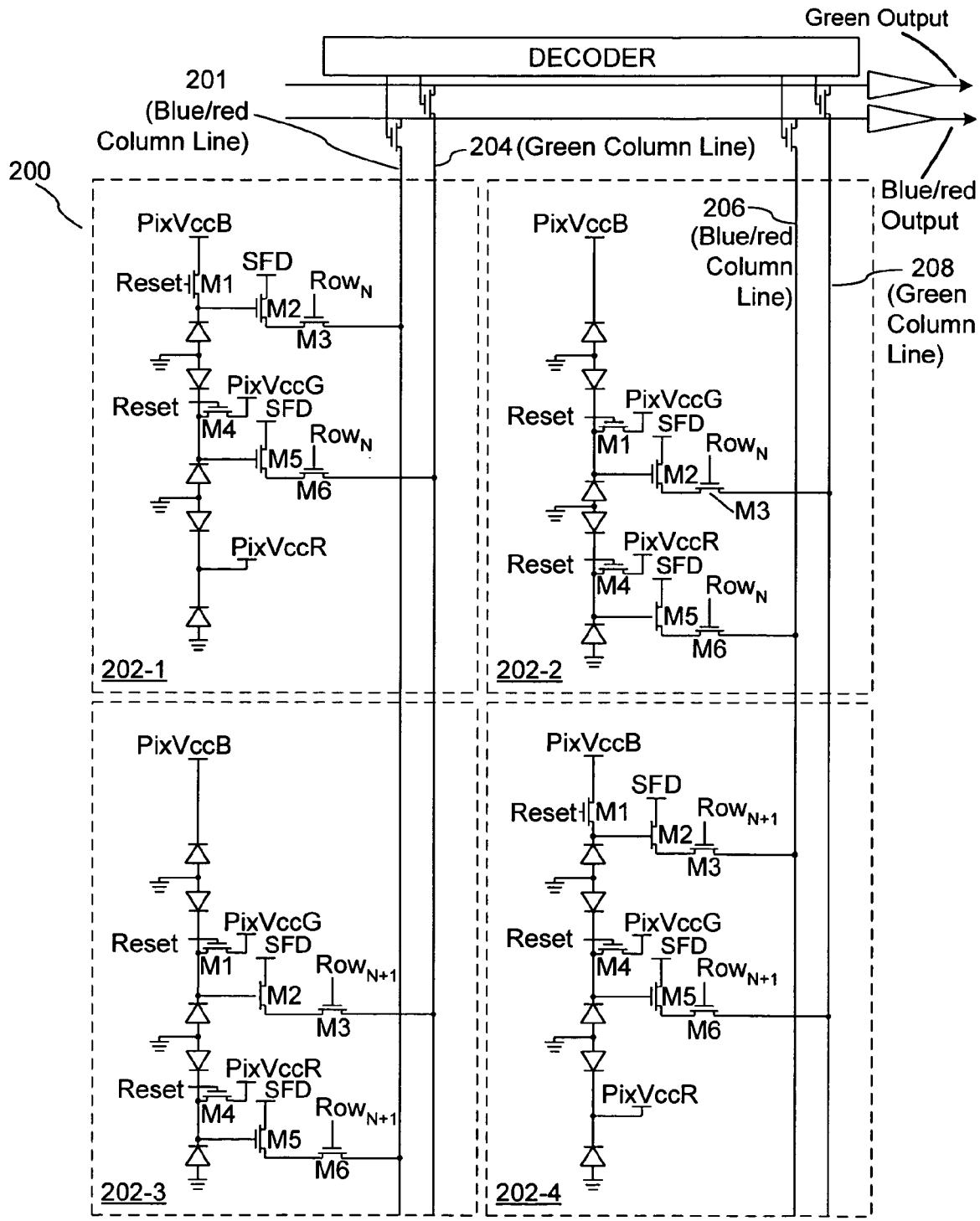

FIG. 13 is a schematic of a mosaic of VCF sensor groups configured to collect two out of three colors per pixel location.

Each of FIGS. 14A and 14B is a schematic illustrating VCF sensor groups of the type shown in FIG. 13 in an array utilizing color filters attached to some of the sensor groups.

Figure 15:
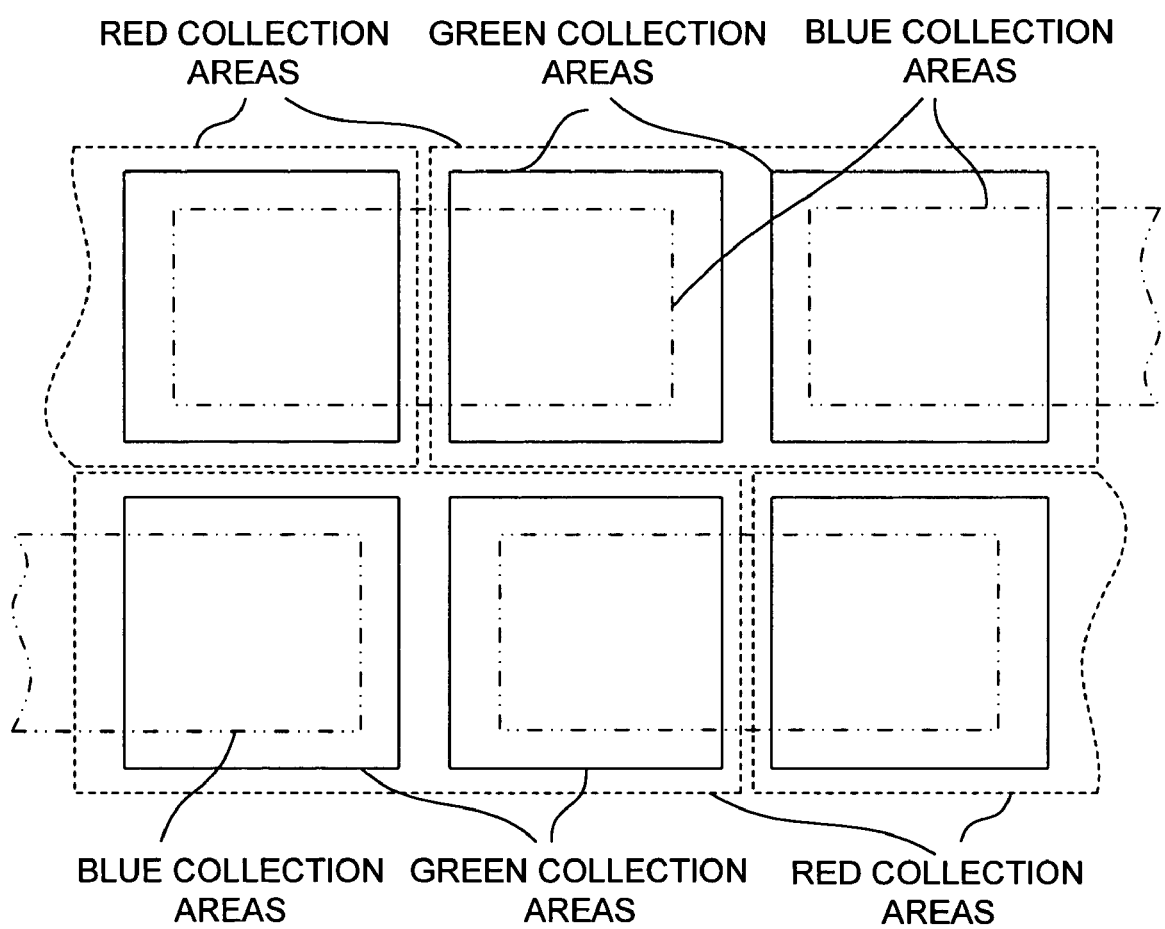

FIG. 15 is a simplified top view of a portion of an array of VCF sensor groups, in which adjacent sensor groups share carrier-collection elements.

Figure 16:
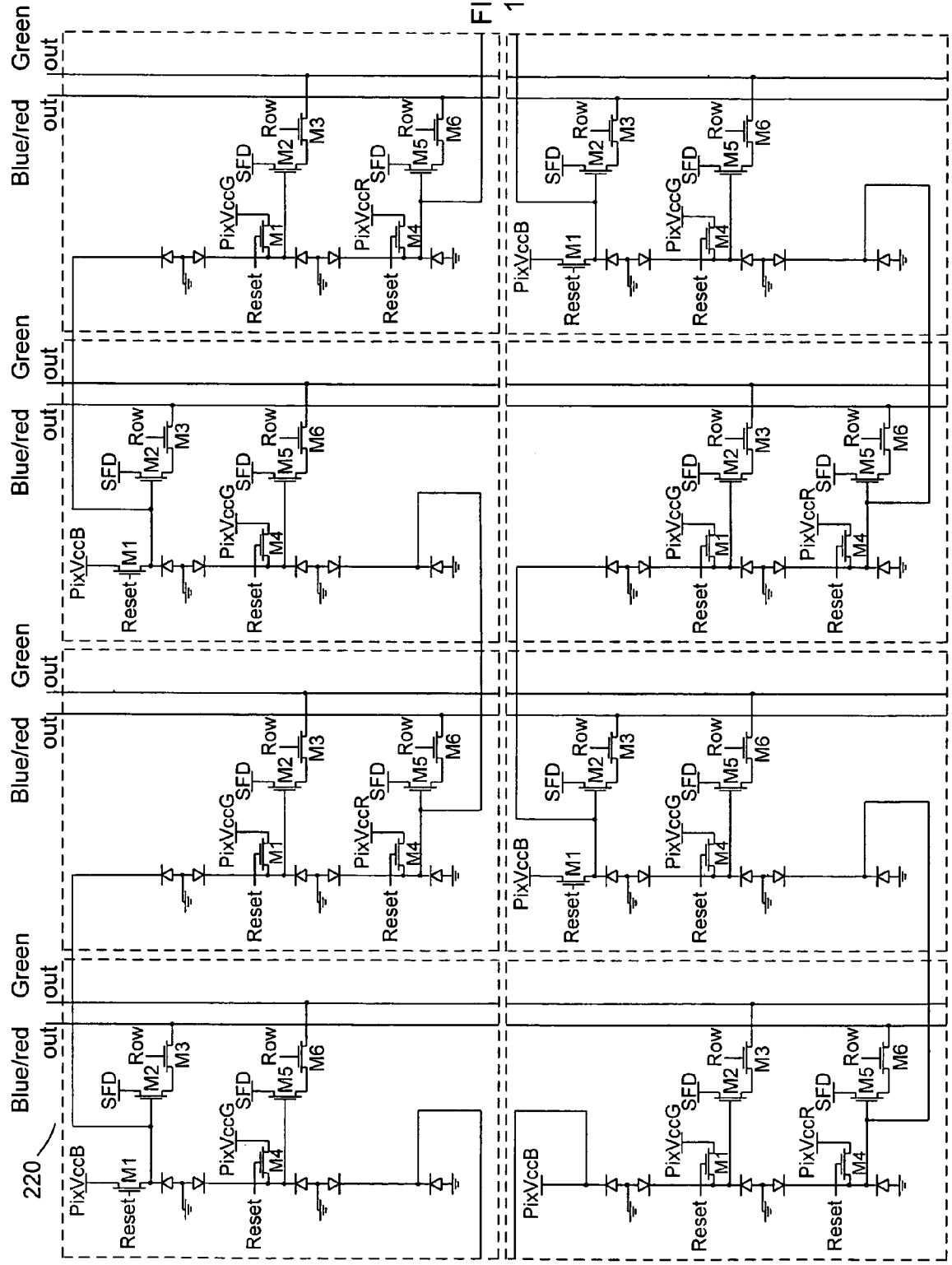

FIG. 16 is a schematic of an array of VCF sensor groups of the type shown in FIG. 15.

Figure 17:
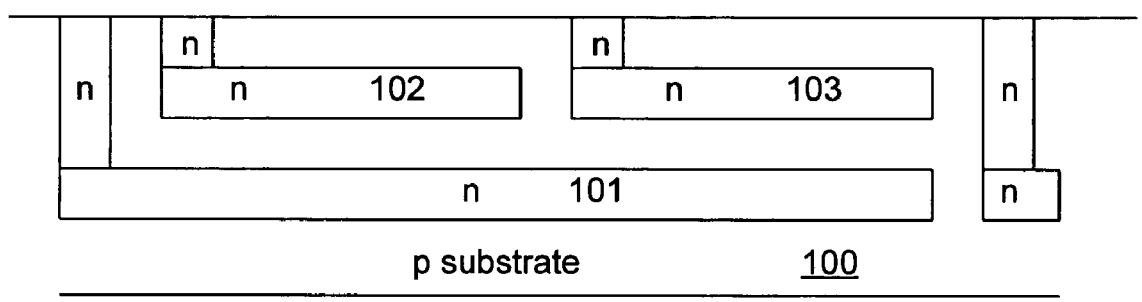

FIG. 17 is a cross-sectional view (in a vertical plane) of two VCF sensor groups of an array, in which two sensor groups share a common sensor element.

Figure 18:
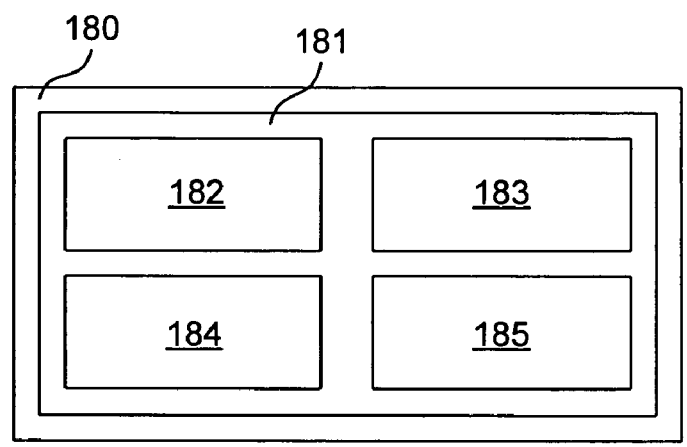

FIG. 18 is a top view of four VCF sensor groups of an array, in which the four sensor groups share carrier-collection areas for collecting carriers that have been photo-generated by absorption of red and blue photons.

Figure 19:
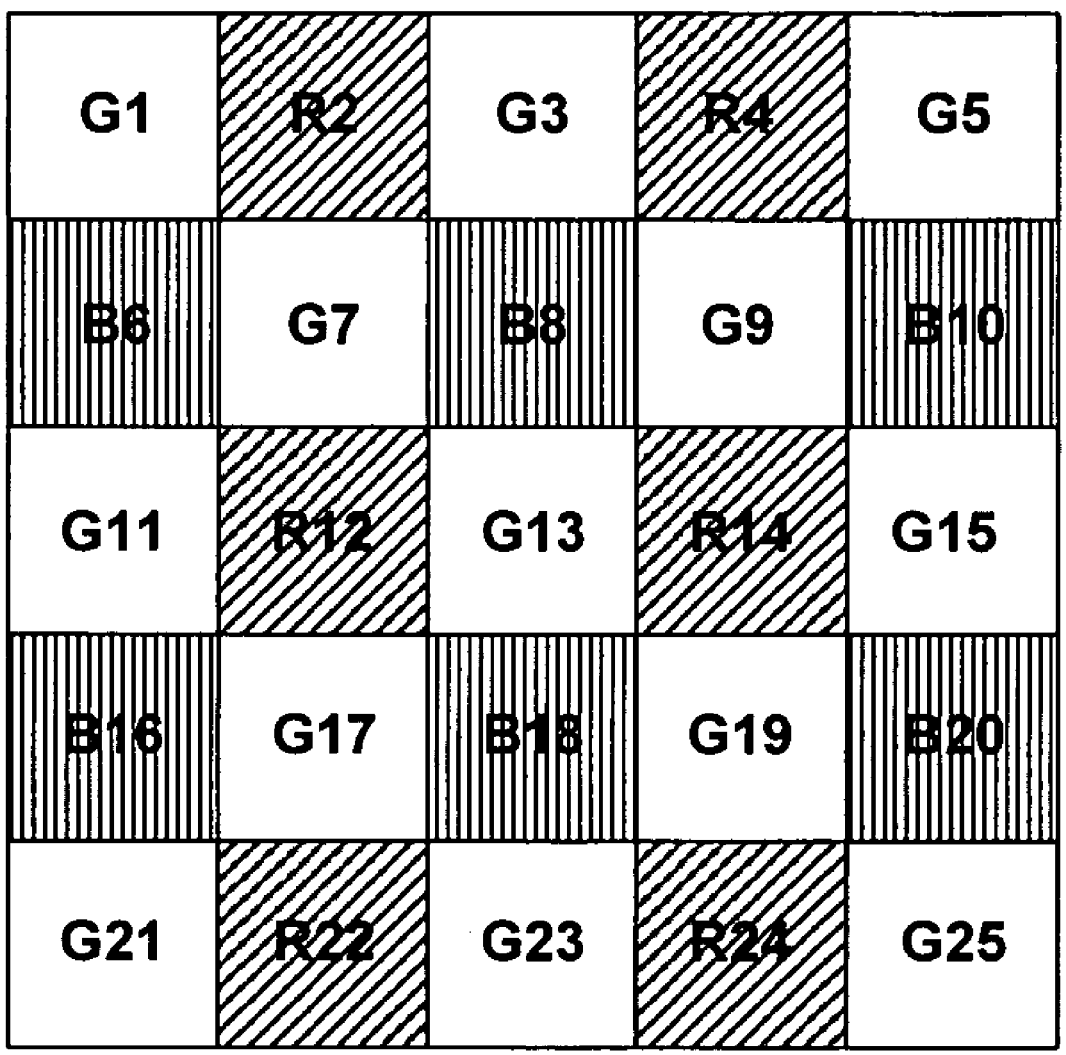

FIG. 19 is an example of a Bayer pattern.

Figure 20:
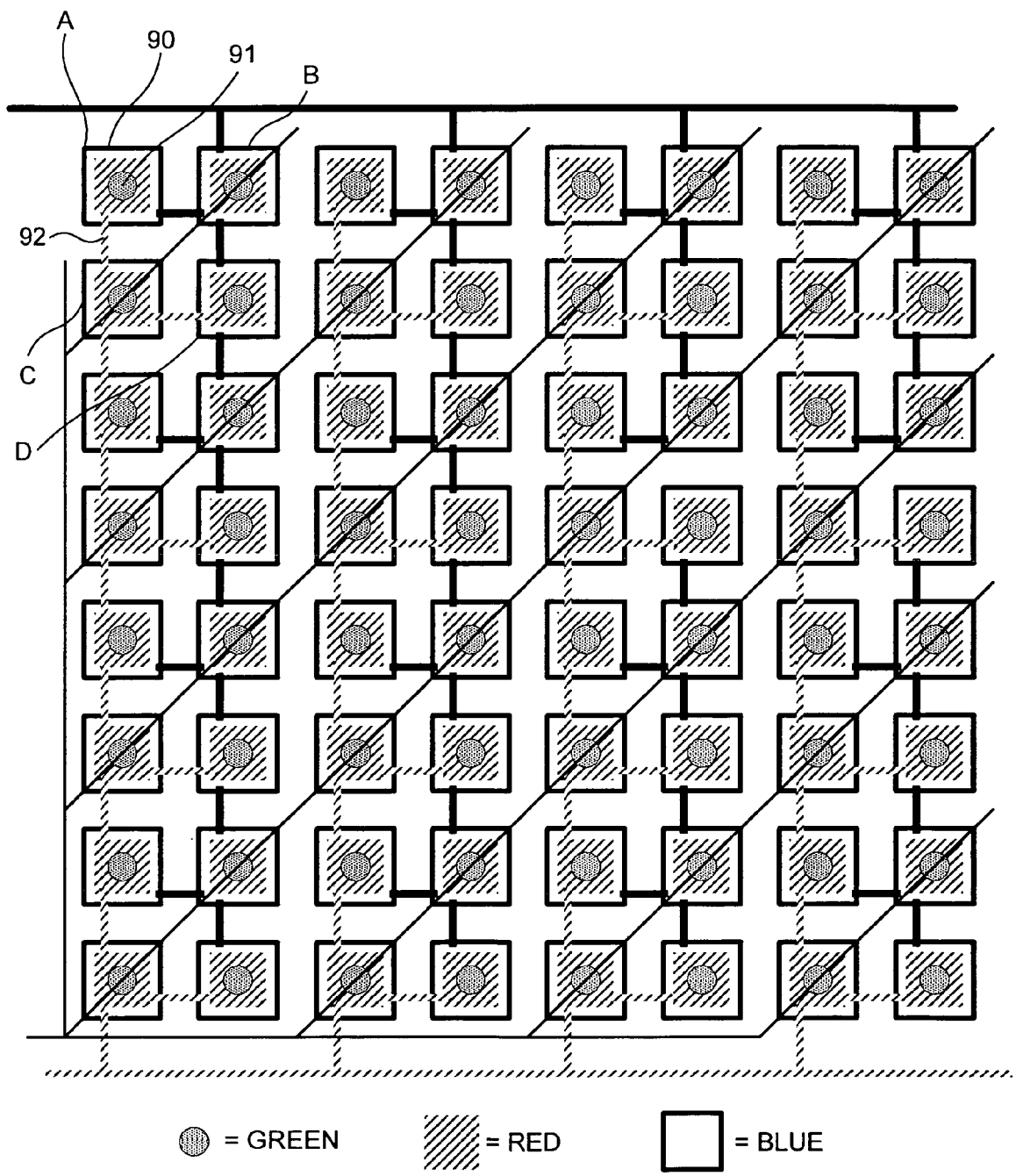

FIG. 20 is a top view of an array of VCF sensor groups that emulates the Bayer pattern of FIG. 19, but which does not utilize the output of each sensor of each of the sensor groups.

Figure 21:
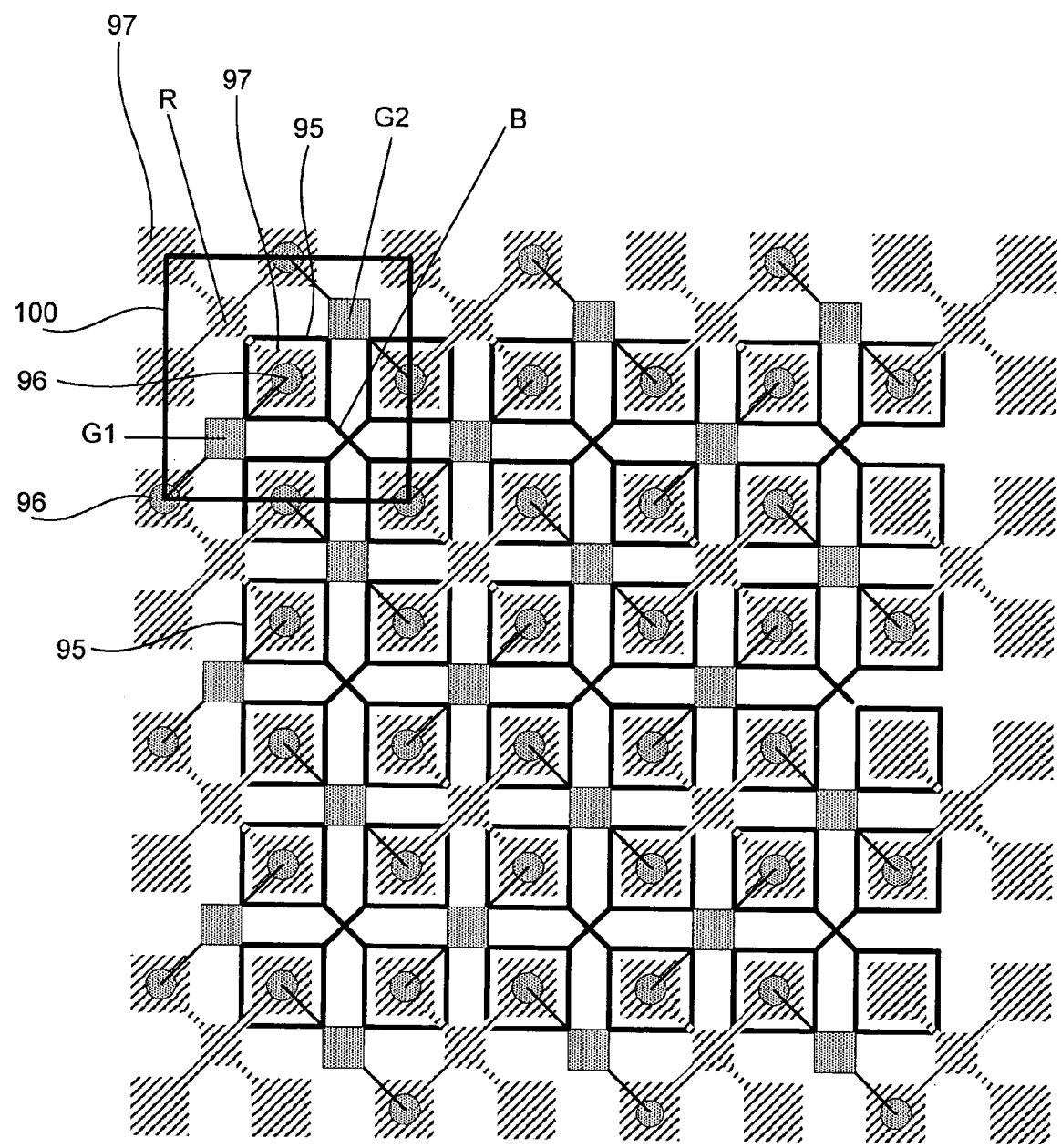

FIG. 21 is a top view of an array of VCF sensor groups which embodies the invention, and which does utilize the output of each sensor of each of the sensor groups.

Figure 22:
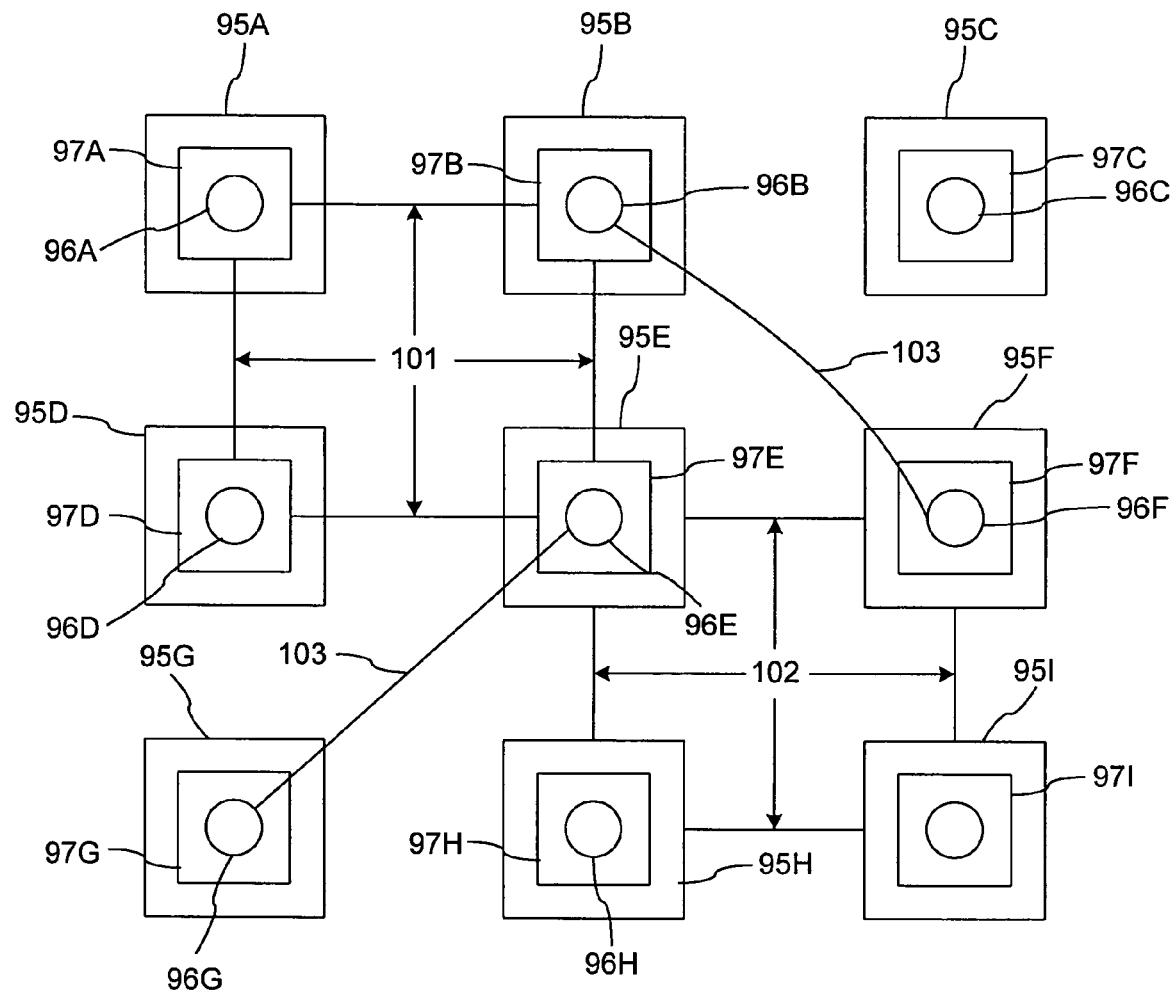

FIG. 22 is a top view of the nine sensor groups in the upper left corner of the FIG. 21 array.

Figure 23:
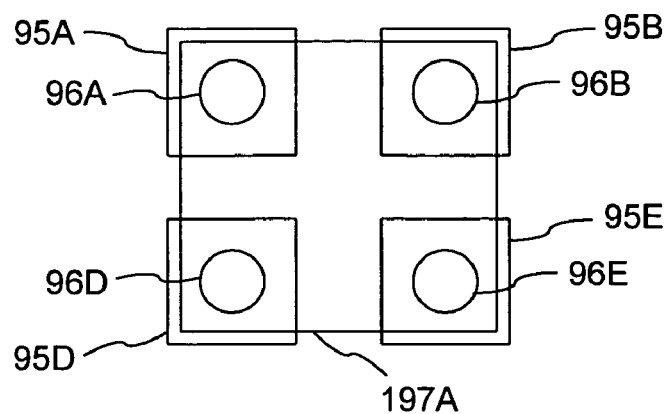

FIG. 23 is a top view of four sensor groups in the upper left corner of a variation on the FIG. 21 array.

Figure 24:
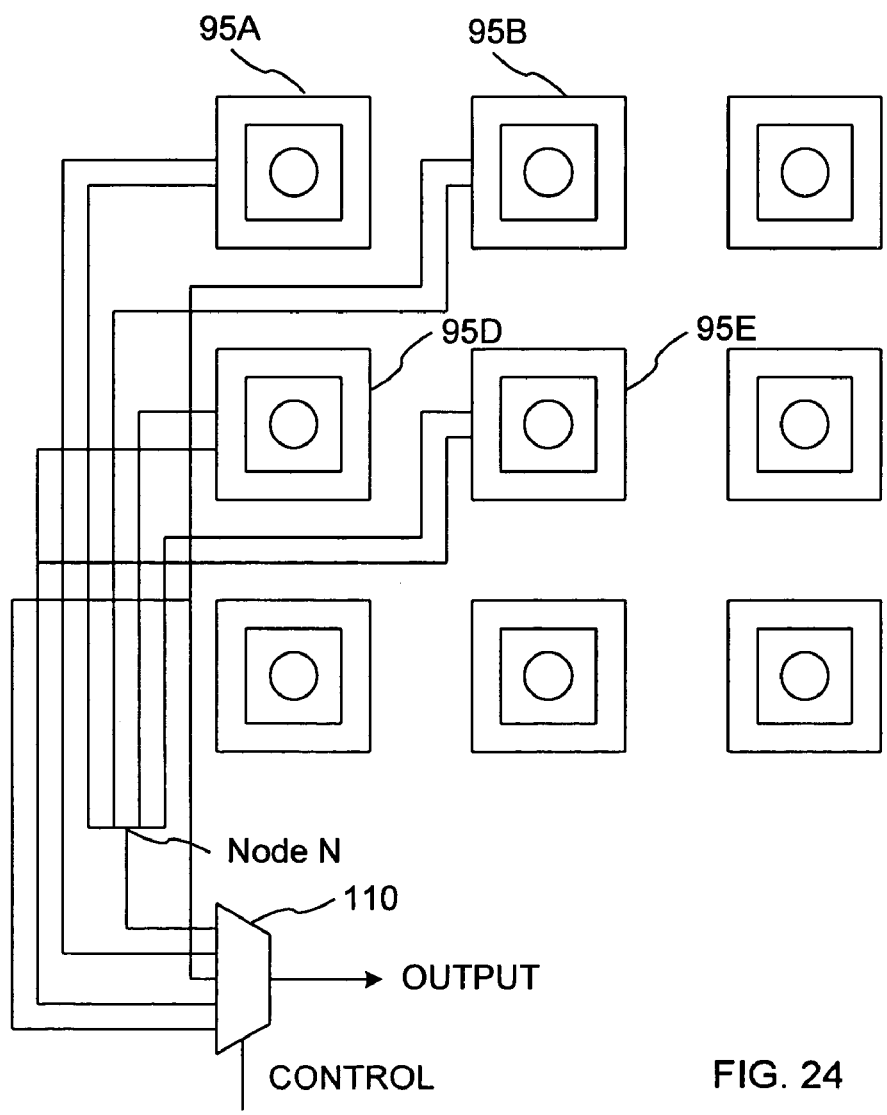

FIG. 24 is a top view of nine sensor groups of an array that embodies the invention, with a schematic diagram of readout circuitry coupled to some of the sensor groups.

Figure 25:
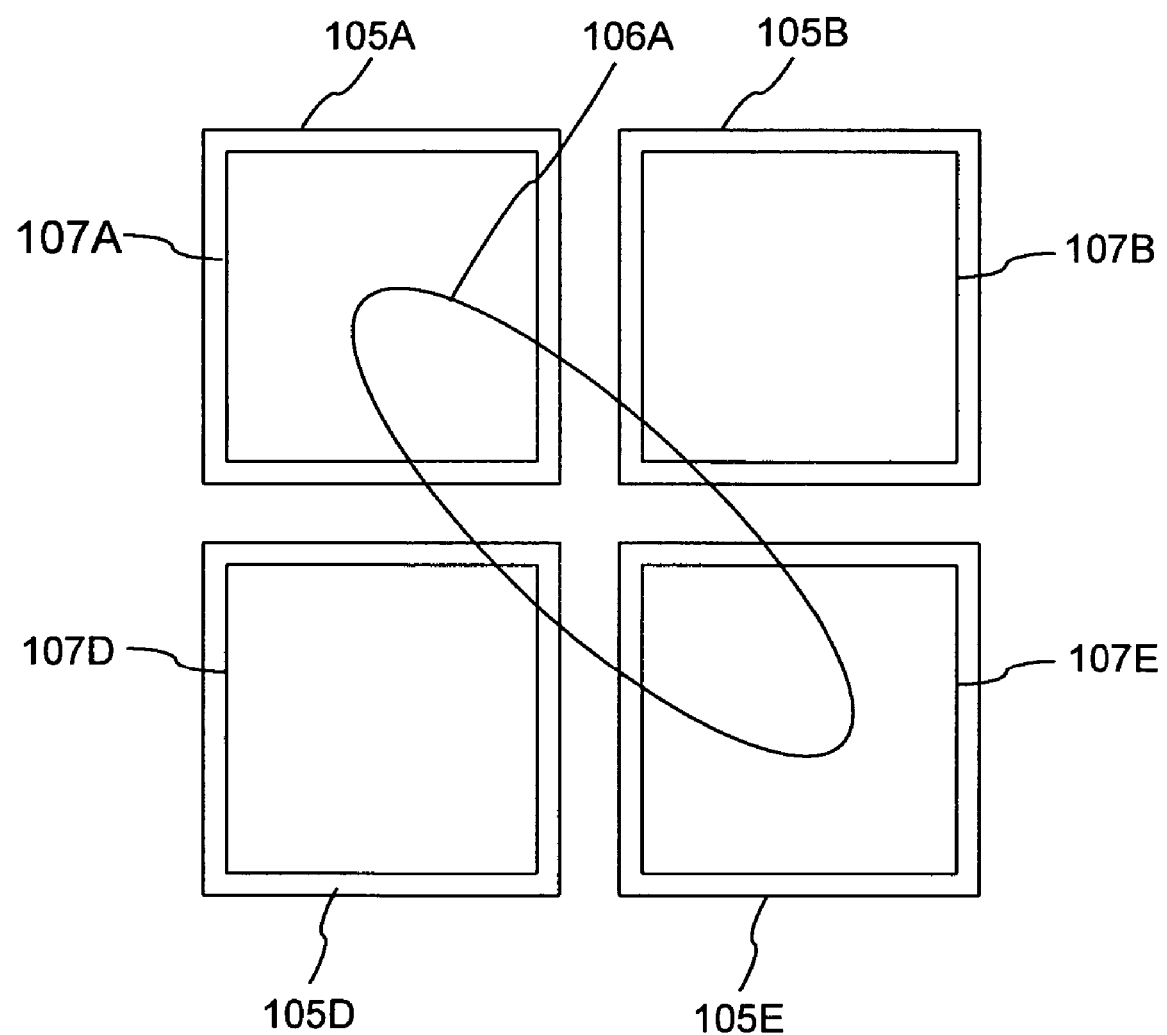

FIG. 25 is top view of four sensor groups of another VCF sensor group array that can embody the invention.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Each sensor of a VCF sensor group senses photons by directly or indirectly converting their energy into electron-hole pairs. This conversion occurs in semiconducting material. A VCF sensor group is typically implemented so that the output of each sensor in the group is indicative of incident photon intensity in a different wavelength band. The radiation that reaches each sensor in a VCF sensor group has a different wavelength-intensity spectrum due to the filtering action of the material forming the sensor group. Thus, all sensors in a VCF sensor group can be identical and each sensor can still produce an output that is indicative of a different wavelength band. In some embodiments, however, the sensors in a VCF sensor group are not all identical (e.g., they do not all consist of the same material or combination of materials), and the structure and composition of each is determined so as to optimize or improve the sensor group's performance for a predetermined application. For example, a sensor having relatively high sensitivity to a given range of wavelengths (i.e., relatively high absorptivity in such range) and lower sensitivity to other wavelengths, can be vertically stacked with sensors made of other materials having different spectral sensitivity to form a VCF sensor group.

Color output for a digital still camera (DSC) requires sensing of a minimum of three spectral bands due to the tri-chromatic nature of the human visual system. Thus, many embodiments of VCF sensor groups have three vertically stacked sensors (each comprising semiconductor material) for sensing three different spectral bands. VCF sensor groups with two rather than three vertically stacked sensors are useful in other applications, such as for simultaneous detection of visible and infrared radiation. Since there can be advantages to sensing more than three spectral regions, some embodiments of a VCF sensor group have more than three vertically stacked sensors. Using the extra information from additional spectral regions, it can be possible to produce a more accurate representation of the color of an object. As more spectral data are available, the accuracy of color representation potentially improves.

Figure 2:
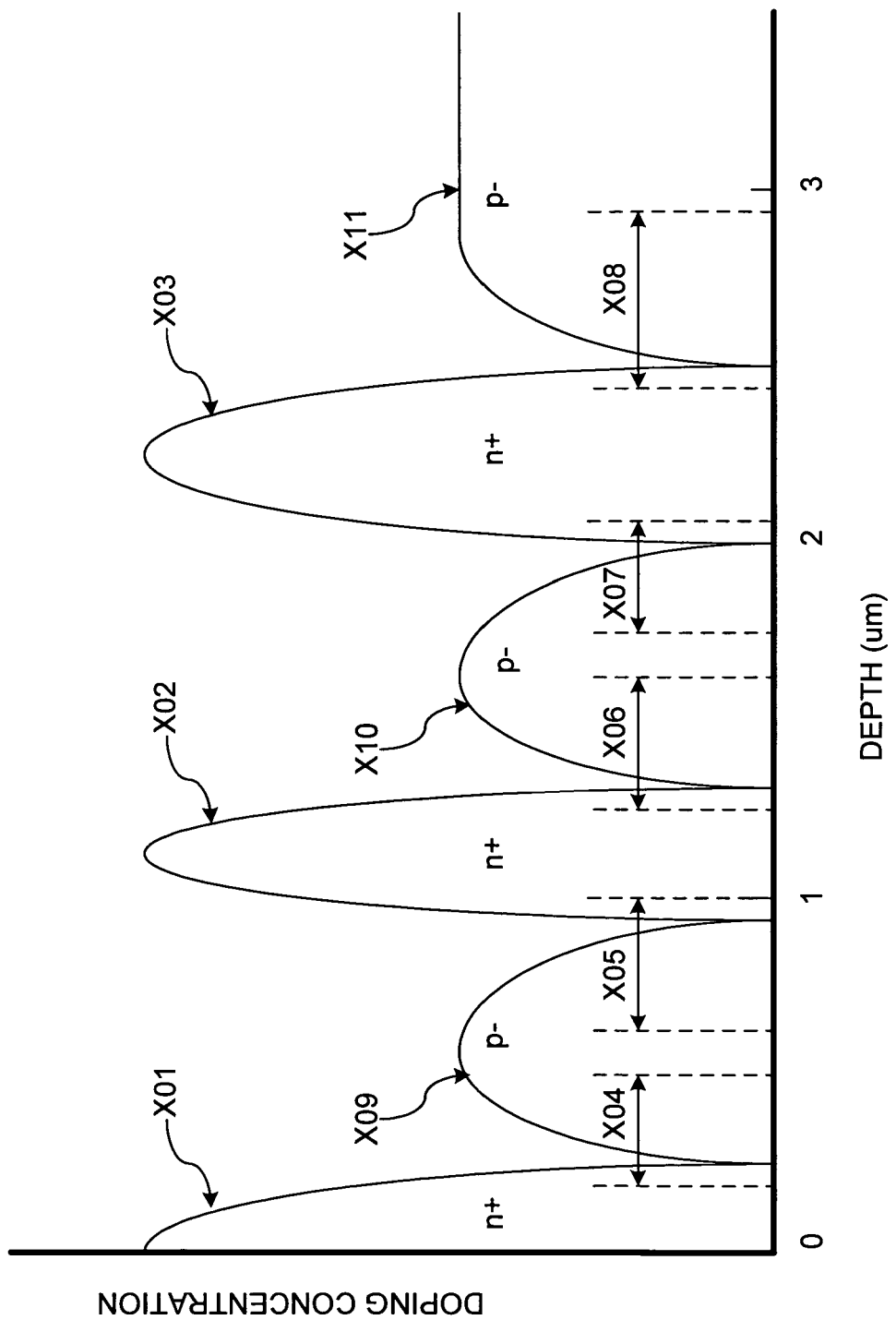
FIG. 2 is a graph indicative of a vertical doping profile for a VCF sensor group that can be used to implement the invention.

In a class of embodiments of the inventive array of VCF sensor group, each sensor of each sensor group includes two layers of semiconductor material (as does the sensor comprising layer X01 and an adjacent portion of layer X09 in FIG. 2) or three layers of semiconductor material (as does the sensor comprising layer X02 and adjacent portions of layers X09 and X10 in FIG. 2), there is a junction (e.g., a "p-n" junction or heterojunction) between each two adjacent layers of a sensor, and one of the sensor's layers is a carrier-collection element having a contact portion (accessible to biasing and readout circuitry). During typical operation, the layers of each sensor are biased so that photogenerated carriers migrate through at least one depletion region to the contact to make a photocharge signal available at the contact portion. In typical embodiments of a VCF sensor group, the group includes material (e.g., the semiconductor material of layer X09 in FIG. 2 that belongs neither to depletion region X04 nor depletion region X05) in which photons can be absorbed and such absorption is likely to produce charge that is detected by readout circuitry, but in which photogenerated carriers can migrate (with significant probability) toward any of at least two different carrier-collection elements. Typically, but not necessarily, all layers of a VCF sensor group consist of semiconductor material.

Figure 1:
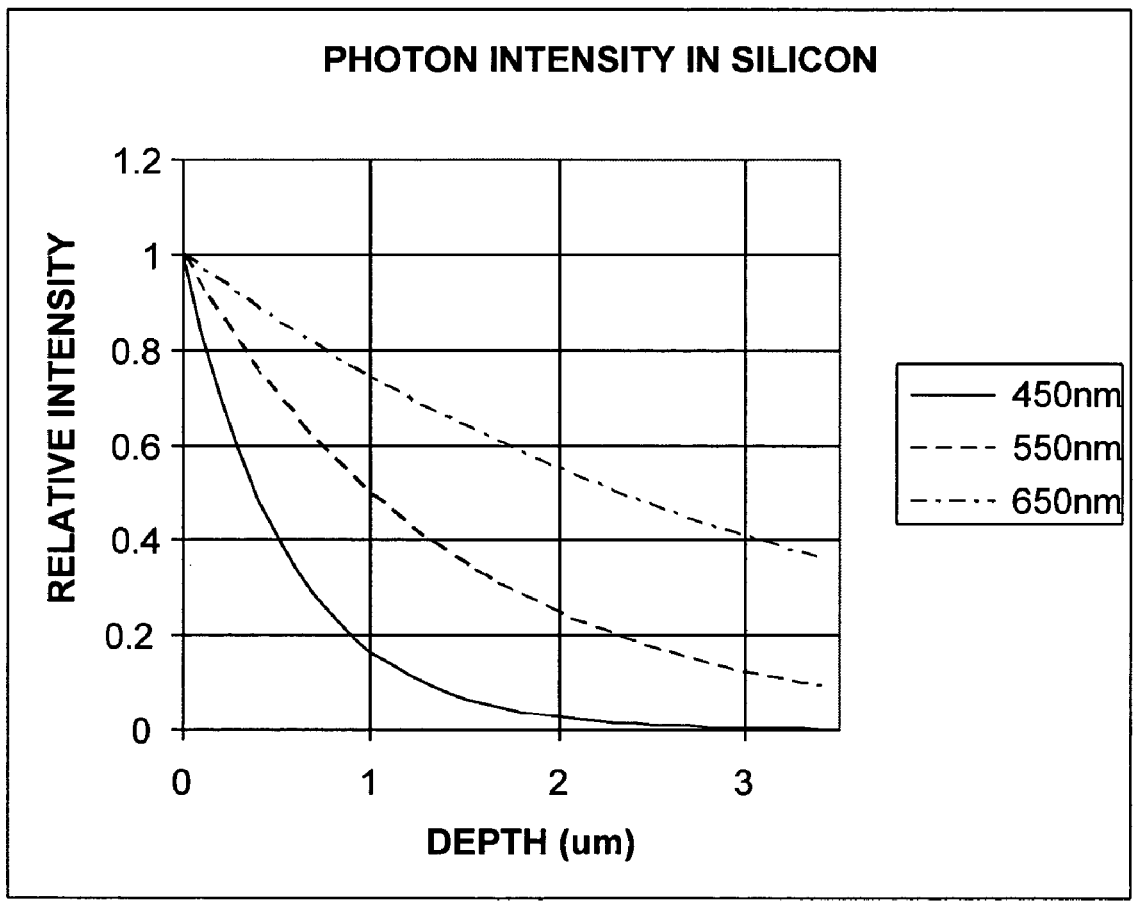
FIG. 1 is a graph of the intensity of electromagnetic radiation in crystalline silicon (relative to its incident intensity $I_0$) as a function of depth (in microns) in the silicon, for the wavelengths 450 nm, 550 nm, and 650 nm.
Figure 3:
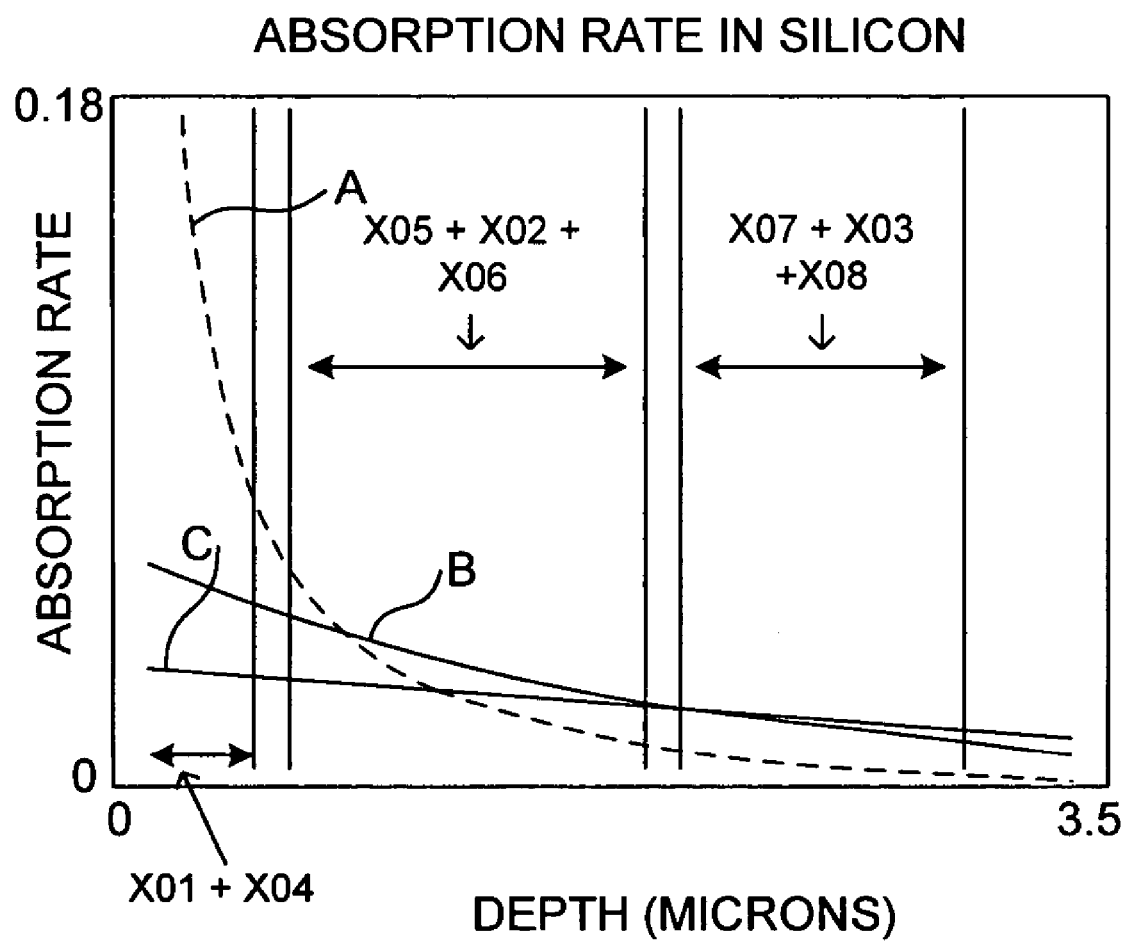
FIG. 3 is a graph of the absorption rate of electromagnetic radiation in crystalline silicon (relative to its incident intensity $I_0$) as a function of depth (in microns) in the silicon, for the wavelengths 450 nm (curve A), 550 nm (curve B), and 650 nm (curve C), with indications of the locations of the FIG. 2 sensor group's layers overlayed thereon.

FIG. 1 is a graph of the intensity of electromagnetic radiation in crystalline silicon (relative to its incident intensity $I_0$) as a function of depth in the silicon, for the wavelengths 450 nm, 550 nm, and 650 nm. FIG. 3 is a graph of the absorption rate of electromagnetic radiation in crystalline silicon (relative to its incident intensity $I_0$) as a function of depth in the silicon, for the wavelengths 450 nm (curve A), 550 nm (curve B), and 650 nm (Curve C), with indications of the locations of the FIG. 2 sensor group's layers overlayed thereon. The graphs of FIGS. 1 and 3 are generated from the same data. Each curve of FIG. 3 plots difference values, with the "n"th difference value being the difference between the "(n+1)th" and "n"th data values of the corresponding curve of FIG. 1. The intensity of radiation (having a given wavelength) as a function of depth in many semiconductors other than silicon is a function similar to those graphed in FIG. 1. FIG. 1 shows that (for each wavelength) the radiation's relative intensity (the ratio $I/I_0$, where "I" is the intensity at depth "x" in the silicon and "$I_0$" is the incident intensity) decreases with increasing depth as the photons are absorbed by the silicon. FIGS. 1 and 3 show that relatively more blue (450 nm) photons are absorbed near the surface than are photons of longer wavelength, and that at any depth in the silicon, more green (550 nm) photons than blue photons are present and that more red (650 nm) photons than green photons are present (assuming equal incident intensity for red, green, and blue photons).

Each of the three curves of FIG. 1 (and FIG. 3) indicates an exponential intensity drop off with increasing depth, and is based on the measured behavior of light in crystalline silicon that has been subjected to typical doping and processing. The exact shape of each curve will depend on the parameters of doping and processing, but there will be only small differences between curves that assume different sets of doping and/or processing parameters. It is well known that the absorption of photons of different wavelengths by a semiconductor depends on the bandgap energy of the semiconductor material and on the details of the states at the band edges. It is also well known that typical semiconductors (e.g., silicon) have different absorptivity to different wavelengths.

As is apparent from FIGS. 1 and 3, a volume of silicon that functions as a sensor in a VCF sensor group at a given depth in a larger volume of the silicon, and has a given thickness, has greater absorptivity to blue light than green light and greater absorptivity to green light than red light. However, if the sensor silicon is sufficiently deep in the larger volume, most of the blue and green light will have been absorbed by the material above the sensor silicon. Even if light having a substantially flat wavelength-intensity spectrum is incident at the surface of the larger volume, the sensor can actually absorb more red light than green or blue light if the intensity of the green and blue light that reaches the sensor is much less than that of the red light that reaches the sensor.

Typical embodiments of a VCF sensor group achieve separation of colors by capturing photons in different ranges of depth in a volume of semiconductor material. FIG. 2 is a vertical doping profile for a VCF sensor group comprising top layer X01 (made of n-type semiconductor), second (p-type) layer X09 below the top layer, third (n-type) layer X02 below the second layer, fourth (p-type) layer X10 below the third layer, fifth (n-type) layer X03 below the fourth layer, and p-type semiconductor substrate X11 below the fifth layer.

Figure 2A:
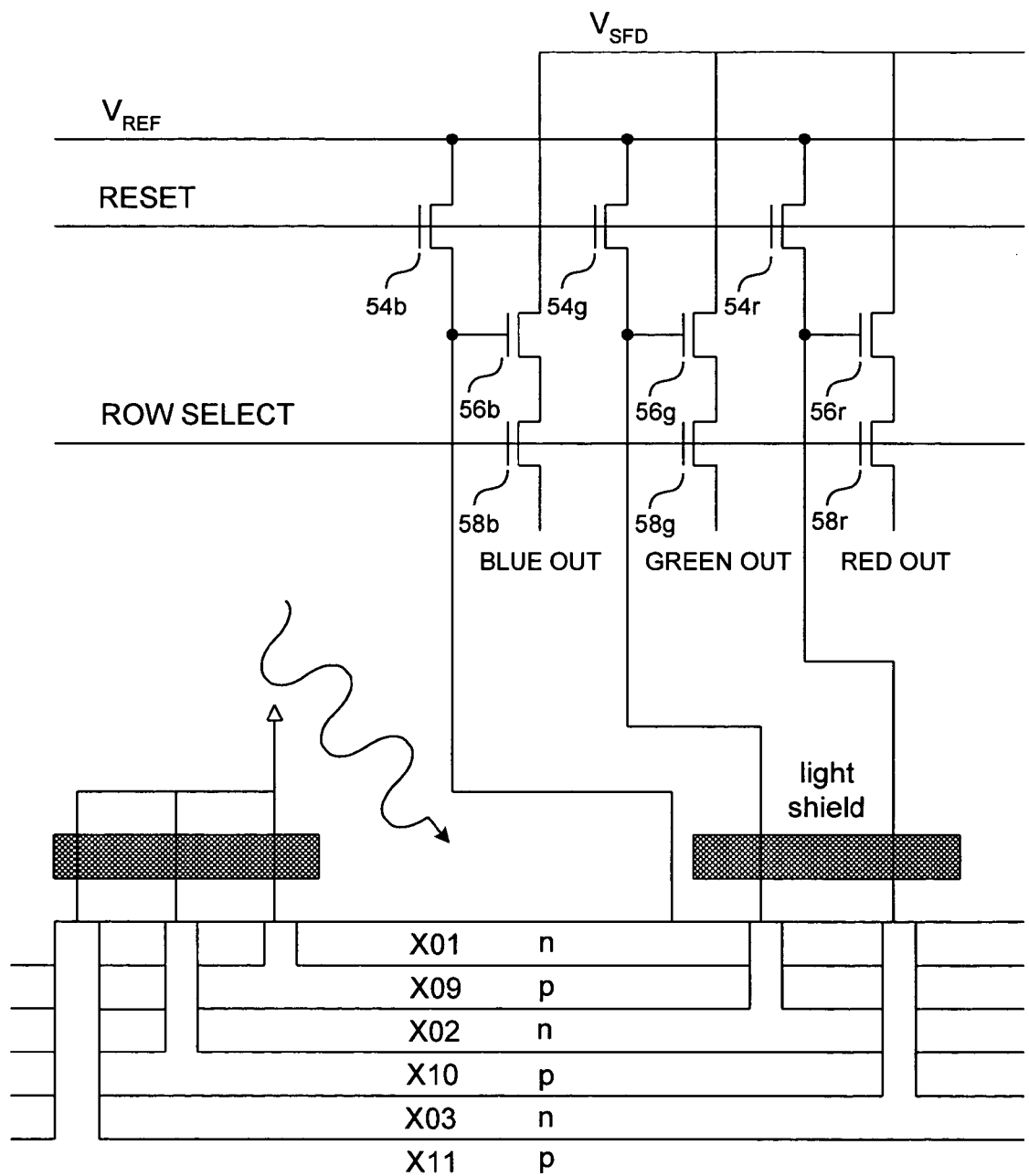
FIG. 2A is a cross-sectional view (in a vertical plane) of the VCF sensor group whose profile is shown in FIG. 2, with a schematic circuit diagram of biasing and readout circuitry coupled to the sensor group.

FIG. 2A is a cross-sectional view (in a vertical plane) of this VCF sensor group. As shown in FIG. 2A, biasing and readout circuitry is coupled to layers X01, X02, X03, X04, and X05, and to substrate X11.

Blue, green, and red photodiode sensors are formed by the junctions between the n-type and p-type regions of FIG. 2A, and are disposed at different depths beneath the surface of the semiconductor structure. The red, green, and blue photocharge signals are all taken from the n-type cathodes (X01, X02, and X03) of three isolated photodiodes.

The readout circuitry of FIG. 2A is of the non-storage type, and is similar to that described in above-referenced U.S. Patent Application Publication No. US 2002/0058353A1. Readout circuitry for each sensor includes a reset transistor (54b for the blue sensor, 54g for the green sensor, and 54r for the red sensor) driven from a RESET signal line and coupled between the photodiode cathode and a reset potential (identified as $V_{REF}$ in FIG. 2A), a source-follower amplifier transistor (one of transistors 56b, 56g, and 56r) whose gate is coupled to the photodiode cathode and whose drain is maintained at potential $V_{SFD}$ during operation, and a row-select transistor (one of transistors 58b, 58g, and 58r) driven from a ROW-SELECT signal line and coupled between the source of the relevant source follower amplifier transistor and a row line. The suffixes "r," "g," and "b" are used to denote the wavelength band (red, green, or blue) associated with each transistor. As is known in the art, the RESET signal is active to reset the pixel and is then inactive during exposure, after which the row select line is activated to read out the detected signal.

Each of p-type regions X09, X10, and X11 is held at ground potential during operation. Each of n-type layers X01, X02, and X03 is a carrier-collection element having a contact portion accessible to (and that can be coupled to) the biasing and readout circuitry. Before each readout of the sensor group, the biasing circuitry resets each of the n-type layers to the reset potential (above ground potential). During exposure to radiation to be sensed, the reversed-biased pairs of adjacent p-type and n-type layers function as photodiodes: a first photodiode whose cathode is layer X01 and whose anode is layer X09; a second photodiode whose cathode is layer X02 and whose anodes are layers X09 and X10; and a third photodiode whose cathode is layer X03 and whose anodes are layers X10 and X11. As shown in FIG. 2, each of the n-type layers X01, X02, and X03 is coupled to biasing and readout circuitry and thus serves as a photodiode terminal.

During typical operation when the photodiodes of FIG. 2 are reverse biased, depletion regions are formed which encompass the majority of the silicon in which photons are absorbed. In FIG. 2, the depletion region for the first photodiode (which senses primarily blue light) is labeled "X04," the depletion regions for the second photodiode (which senses primarily green light) are labeled "X05" and "X06," and the depletion regions for the third photodiode (which senses primarily red light) are labeled "X07" and "X08." The fields within the depletion regions separate the electron hole pairs formed by the absorption of photons. This leaves charge on the cathode of each photodiode, and readout circuitry coupled to each cathode converts this charge into an electrical signal. The charge on the cathode of each photodiode is proportional to the number of photons absorbed by the photodiode. This proportionality is the quantum efficiency, QE.

FIG. 3 shows the same curves shown in FIG. 1 (indicative of the absorption of blue, green, and red photons by silicon) and also includes lines indicating the extent of the carrier-collection elements (X01, X02, and X03) and depletion regions of the FIG. 2 structure. Thus, the region labeled "X01+X04" in FIG. 3 represents the region of FIG. 2 above the lower surface of depletion region X04, the region labeled "X05+X02+X06" in FIG. 3 represents the region of FIG. 2 between the upper surface of depletion region X05 and the lower surface of depletion region X06, and the region labeled "X07+X03+X08" in FIG. 3 represents the region of FIG. 2 between the upper surface of depletion region X07 and the lower surface of depletion region X08. FIG. 3 thus illustrates the three distinct "sensor" regions in which the three photodiodes of FIG. 2 absorb photons and in which charge resulting from such absorption remains (and does not migrate outside the sensor region in which it is produced) and can be measured by readout circuitry. It should be recognized, however, that electron-hole pairs created between the three sensor regions (e.g., electron-hole pairs created in layer X09 between the lower surface of depletion region X04 and the upper surface of depletion region X05) can still diffuse (with high efficiency) into the sensor regions and create charge on the photodiodes that can be measured by readout circuitry.

The selective absorption of photons by wavelength determines the photo response of the three photodiodes. If one considers the position of the sensor regions ("X01+X04," "X05+X02+X06," and "X07+X03+X08") in relation to the curves of FIG. 3 for 450 nm, 550 nm and 650 nm photons, one will see that the depth and extent of the sensor regions determines the spectral response. In the "X01+X04" region, much more incident blue light is absorbed than incident green and red light, but some small amount of green and red light is absorbed. In the "X01+X04" region much less incident green light is absorbed than incident blue light, and much more incident green light is absorbed than incident red light. In the "X05+X02+X06" region, more incident green light is absorbed than incident blue light (since most of the blue light incident at region "X01+X04" is absorbed in that region and does not reach region "X05+X02+X06"), and more incident green light is absorbed than incident red light (even though only a small amount of the red light incident at region "X01+X04" is absorbed in that region so that most such red light reaches region "X05+X02+X06").

Figure 4:
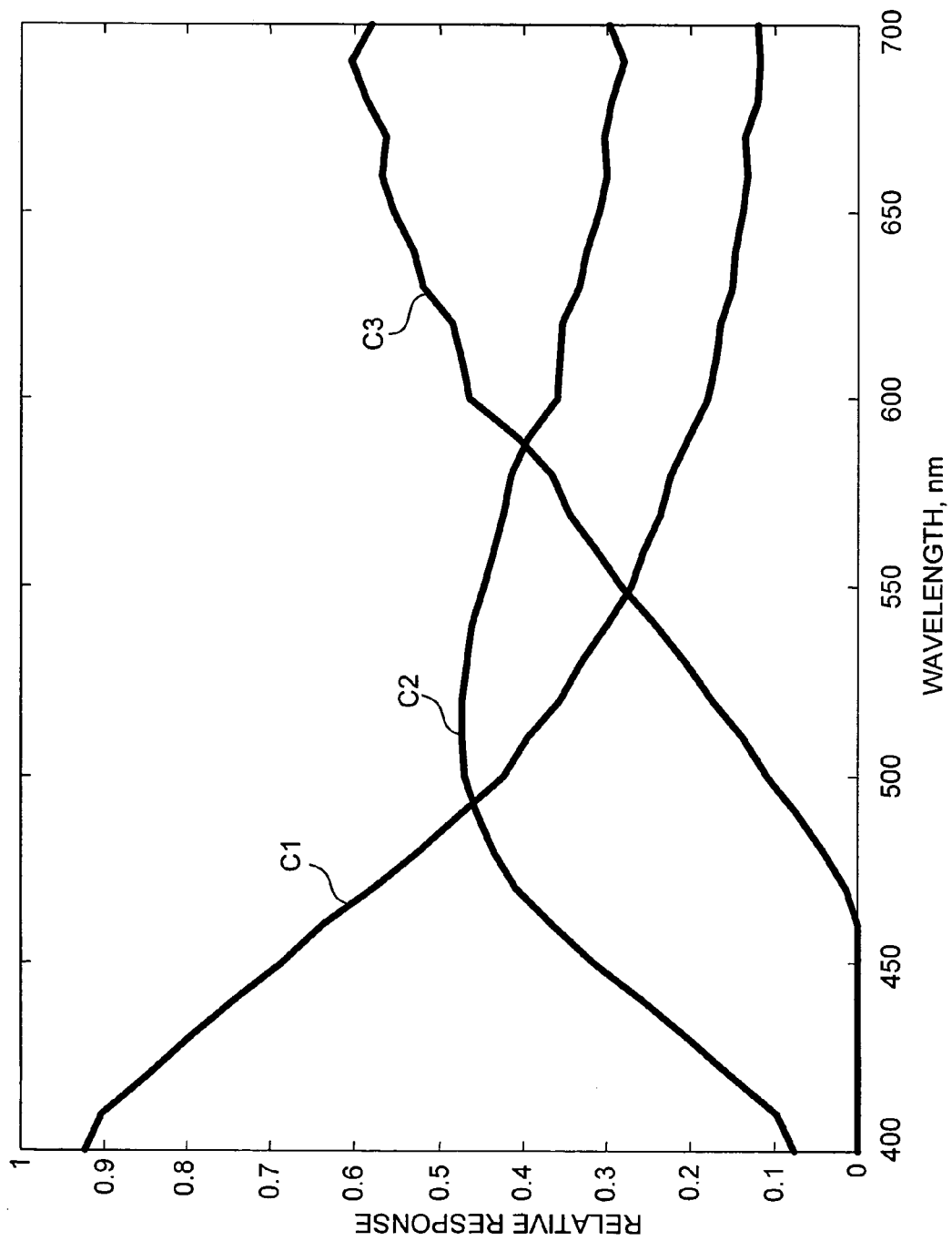
FIG. 4 is a graph of the spectral response of the three photodiodes of the sensor group whose profile is similar to that shown in FIG. 2.

The full range of incident wavelengths (not just the three wavelengths 450 nm, 550 nm and 650 nm) determines the spectral response of the three photodiodes of FIG. 2, which is similar to that shown in FIG. 4. Curve C1 in FIG. 4 is the spectral response of a top ("blue") photodiode similar to the top ("blue") photodiode of FIG. 2, curve C2 in FIG. 4 is the spectral response of a middle ("green") photodiode similar to the middle ("green") photodiode of FIG. 2, and curve C3 in FIG. 4 is the spectral response of a bottom ("red") photodiode similar to the bottom ("red") photodiode of FIG. 2.

Figure 5:
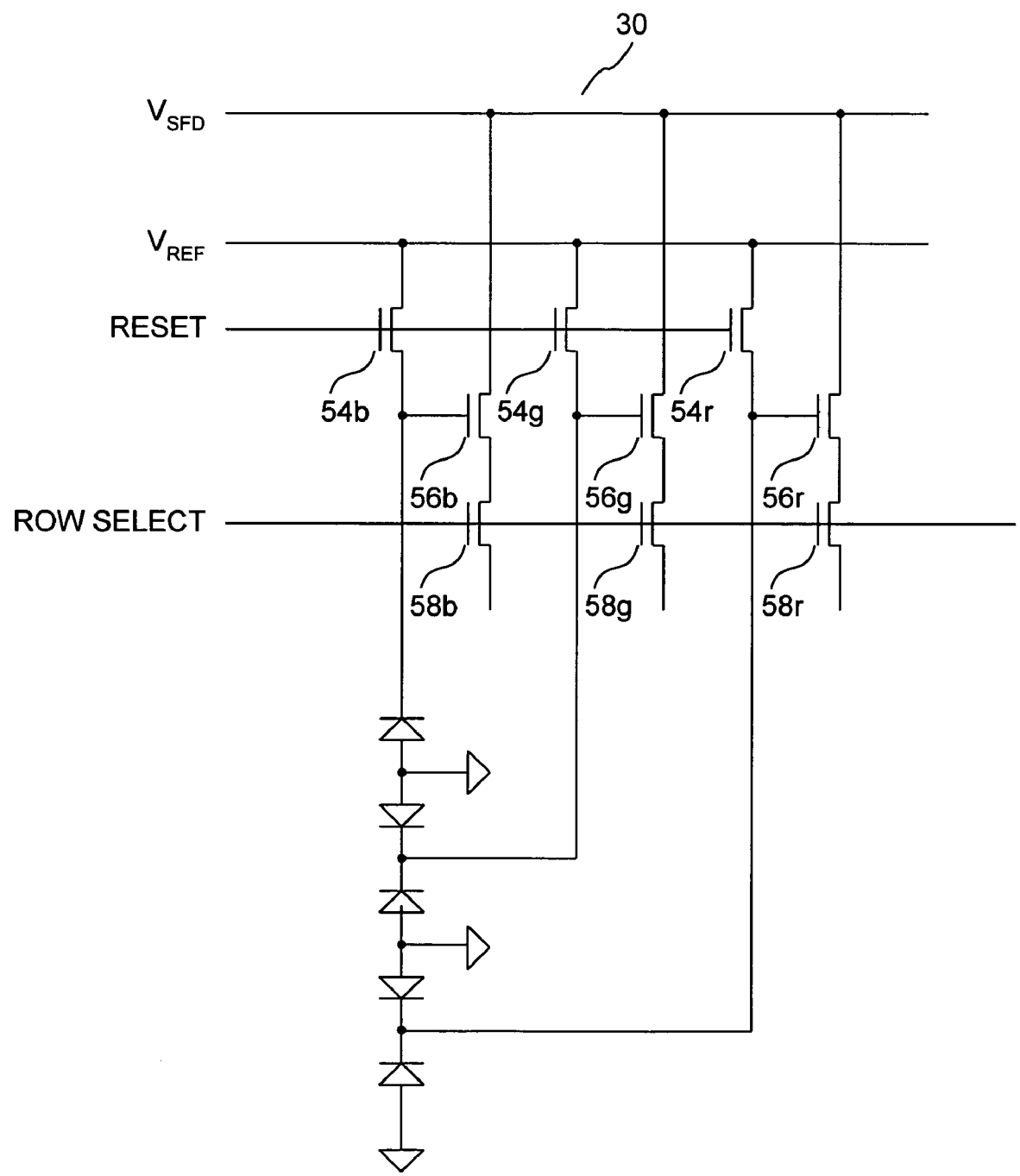
FIG. 5 is a diagram of the VCF sensor group and biasing and readout circuitry of FIG. 2A, in which the photodiode sensors are represented schematically as semiconductor diode symbols.

In an important class of embodiments (including the VCF sensor group of FIG. 2), each VCF sensor group implements three photodiodes. Such VCF sensor groups are well suited for use in a DSC or digital video camera. However, in other embodiments, each VCF sensor group implements two (or more than three) photodiodes placed at different depths within a volume consisting at least mainly of semiconductor material. The blue, green, and red photodiode sensors of the FIG. 2A sensor group are formed by the junctions between n-type and p-type regions, and are disposed at different depths beneath the surface of the semiconductor structure. The red, green, and blue photocurrent signals are all taken from the n-type cathodes of three isolated photodiodes. This is shown schematically in FIG. 5, which depicts the same VCF sensor group as is shown in FIG. 2A. In FIG. 5, the photodiodes are represented schematically as semiconductor diode symbols.

Each of FIGS. 2A and 5 shows a non-storage version of biasing and readout circuitry in which each of the red, green, and blue photodiodes is coupled to a transistor circuit. Each circuit has a reset transistor (54*b*, 54*g*, or 54*r*) driven from a RESET signal line and coupled between the photodiode cathode and a reset potential VREF, a source-follower amplifier transistor (56*b*, 56*g*, or 56*r*) coupled to the photodiode cathode, and a row-select transistor (58*b*, 58*g*, or 58*r*) driven from a ROW-SELECT signal line and coupled between the source of the source follower amplifier transistor and a row line. As is known in the art, the RESET signal is active to reset the pixel and is then inactive during exposure, after which the row select line is activated to read out the pixel data.

In alternative embodiments, a "storage" version of biasing and readout circuitry, as described in above-referenced U.S. Patent Application Ser. No. 10/103,304, is used in place of "non-storage" biasing and readout circuitry such as that of FIG. 2A.

From the disclosure herein, persons of ordinary skill in the art will recognize that there are numerous ways to realize VCF sensor groups in a semiconductor structure. For example, the six-layer structure of alternating p-type and n-type regions can be formed using a semiconductor substrate as the bottom layer and forming five concentric wells of alternating conductivity type in the substrate.

Figure 6:
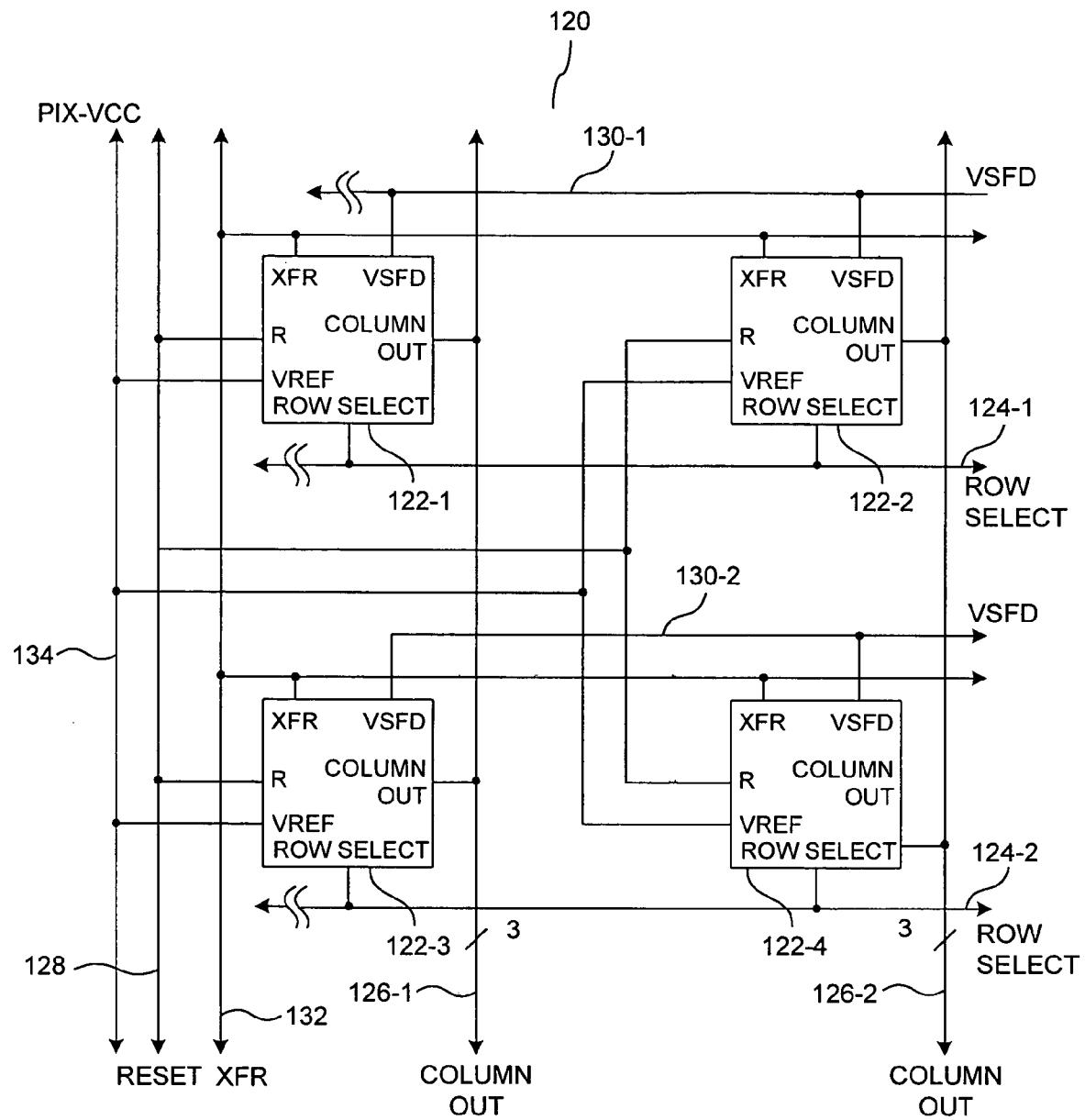
FIG. 6 is a diagram of an imaging array that can be implemented in accordance with the present invention.

Referring now to FIG. 6, a diagram shows an illustrative 2 by 2 portion 120 of an array of VCF sensor groups that may be used in accordance with the present invention. Persons of ordinary skill in the art will readily appreciate that the array portion disclosed in FIG. 6 is illustrative only and that arrays of arbitrary size may be fabricated using the teachings herein. The illustrative array example of FIG. 6 employs circuitry with a storage feature including a transfer transistor and so includes a global transfer signal line serving the array. Persons of ordinary skill in the art will appreciate that arrays employing circuitry similar to that depicted in FIGS. 2A and 5 without storage and thus without a transfer transistor are also contemplated as within the scope of the present invention and that such arrays will not include a transfer signal line.

Common RESET and XFR lines can be provided for all of the VCF sensor groups in the array. As presently preferred, a separate VSFD line is provided for each row in the array, although embodiments of the present invention having a single VSFD node are also contemplated. Additionally, it is possible to employ a separate VREF potential for each of the three colors of the sensor groups in an array, or to simplify the wiring by connecting the VSFD and VREF signals into a single global node in an array of sensor groups. Referring to FIG. 2A, the source of the row select transistor for each color in a column of the array will be coupled to a separate line associated with that column and the gate of all row select transistors for all colors for each VCF sensor group in a row of the array will be coupled to a ROW-SELECT line associated with that row.

The 2 by 2 portion 120 of the array in FIG. 6 includes two rows and two columns of VCF sensor groups. A first row includes VCF sensor groups 122-1 and 122-2; a second row includes VCF sensor groups 122-3 and 122-4. A first column includes VCF sensor groups 122-1, 122-3; a second column includes VCF sensor groups 122-2 and 122-4.

A first ROW-SELECT line 124-1 is connected to the row-select inputs (ROW-SELECT) of VCF sensor groups 122-1 and 122-2. A second ROW-SELECT line 124-2 is connected to the row-select inputs (ROW-SELECT) of VCF sensor groups 122-3 and 122-4. The first and second ROW-SELECT lines may be driven from a row decoder (not shown) as is well known in the art.

A first set of three (blue, green, and red) "COLUMN OUT lines" 126-1 is connected to the outputs of VCF sensor groups 122-1 and 122-3. A second set of three COLUMN OUT lines 126-2 is connected to the outputs of VCF sensor groups 122-2 and 122-4. The first and second sets of COLUMN OUT lines are coupled to sets of column readout circuits (not shown) similar to circuits that would be used with prior-art single-output active pixel sensors.

A global RESET line 128 is connected to the reset (R) inputs of all of the VCF sensor groups 122-1 through 122-4. A first VSFD line 130-1 is connected to the VSFD inputs of the VCF sensor groups 122-1 and 122-2 in the first row of the array. A second VSFD line 130-2 is connected to the VSFD inputs of the VCF sensor groups 122-3 and 122-4 in the second row of the array. A global XFR line 132 is connected to the XFR inputs of all of the VCF sensor groups 122-1 through 122-4.

A global VREF line 134 is connected to the VREF inputs of all of the VCF sensor groups 122-1 through 122-4. Alternately, multiple VREF lines (one for each column) could be provided.

With reference to FIG. 7A, sensor group 150 is similar to sensor group 30 discussed above. Circuit 152-1 converts photogenerated carriers resulting from blue illumination to electrical signals such as current signals or voltage signals and feeds them to blue column output line 154-1. Circuit 152-2 converts photogenerated carriers resulting from green illumination to electrical signals such as current signals or voltage signals and feeds it to green column output line 154-2. Circuit 152-3 converts photogenerated carriers resulting from red illumination to electrical signals such as current signals or voltage signals and feeds them to red column output line 154-3. To emulate a color filter array pattern, circuitry is implemented at a column selector 156 to allow for individual selection of each electrical signal from the column output lines 154 onto an output bus 158. By introducing intelligence into the circuitry of the column decoder 156, thereby enabling the column decoder 156 to multiplex the column output lines 154, the order of color readout is made programmable. This results in a sensor that can read out different color filter array patterns, or can read out full measured color data.

An alternative implementation of sensor group 150 is shown in FIG. 7B. In this embodiment, the sensor group biasing and readout circuitry and column output lines are similar to those shown in FIG. 7A. Instead of a single output bus, there are now three output buses 159, 160, 161, one corresponding to each color. The column output lines from each of the columns in the array can be switched onto the output buses by means of switches 162, 163, 164 controlled by a selector 165. The output buses connect to a selector 166 that controls which of the buses are selected and therefore controls how the data is read out of the sensor. Optionally, the outputs corresponding to the three buses can directly sensed thereby permitting simultaneous sensing of the signals. This arrangement allows for a design wherein all three colors can be read out in parallel or serial, or a color filter array can be emulated that reads out one color at a time.

Figures 8A, 8B:
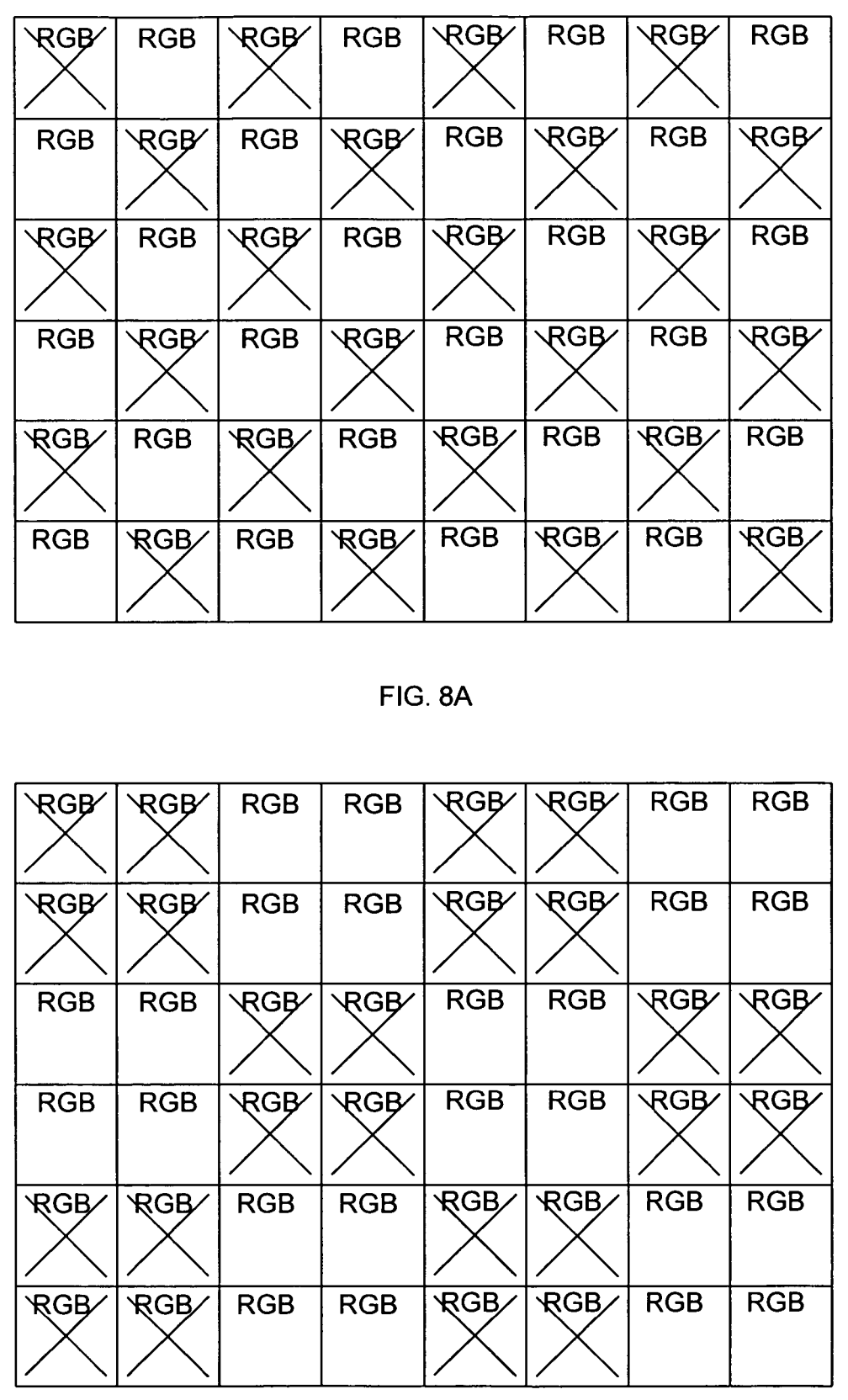
Figures 8C, 8D:
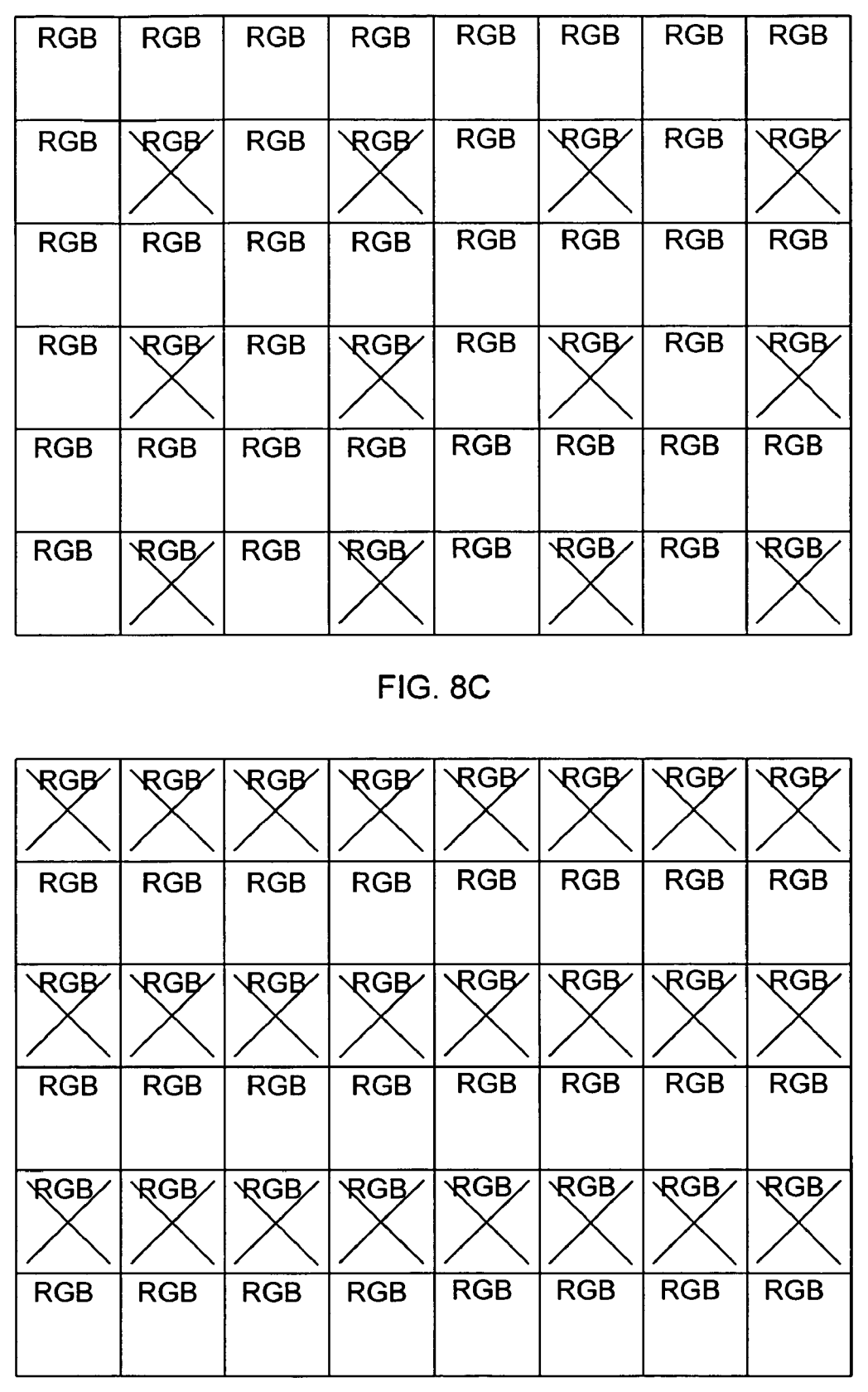

FIGS. 7A and 7B indicate how a single sensor group might be connected. As illustrated in FIGS. 8A–8F, multiple sensor groups 150 can be connected, optionally with color filters represented by a large X within the sensor group. The color filters indicated by the X markers can be organic, dielectric, polysilicon, or other types of color filters. In a preferred embodiment shown in FIG. 8A, color filters are distributed among VCF sensor groups in an alternating or "checkerboard" manner, thus obtaining optimal spatial frequency between sensor groups connected to color filters and sensor groups not connected to color filters. In FIG. 8B, the color filters are distributed in a manner that permits both full-measured color readout and mosaic emulation readout, while guaranteeing that both types of image readouts contain every combination of sensor group output and color filter. FIGS. 8C, 8D, 8E, and 8F illustrate other sensor group and color filter combinations that offer the ability to make a sensor group array with up to 6 different color response characteristics distributed among the pixels of the array.

Programming the order of color readout is desirable because it can allow for switching between different levels of quality and resolution, and can provide dynamic control of the color filter array pattern, thus enabling selection of an optimal pattern based on factors such as image content or lighting conditions.

In the array illustrated in FIG. 9 (or FIG. 20), implementation of a traditional color filter array pattern, such as a Bayer pattern, is achieved by combining four VCF sensor groups in a sub-array 167 having two rows and two columns. The outputs from the sensor groups of a given row can be selected onto the shared column output lines through the row select transistors, and the column output lines can be multiplexed onto an output bus by means of a decoder 169. Although the color filters for all three colors blue, green and red are active, each sensor group 168-1 through 168-4 is wired to read out a single color. As illustrated, sensor group 168-1 reads out a blue signal, sensor groups 168-2 and 168-3 read out a green signal, and sensor group 168-4 reads out a red signal. In this way, each sensor group functions as a pixel that collects only one wavelength band that is determined by the color filter responses of the photodetectors that exist at each pixel location. Sub-array 167 results in a fixed color mosaic pattern, and this sub-array can be incorporated into a larger array of VCF sensor groups to form an image sensor array that generates an output signal similar to that generated by a traditional color filter array-based image sensor. In FIG. 9, a Bayer pattern is shown, but any pattern that is based on a three color filter array can be implemented. In comparison to traditional color filter methods, using sensor groups 168-1 through 168-4 in this manner offers the aforementioned benefits of lower manufacturing costs, more stable color filters, and easy interface to systems that require color sub-sampled data as input. Additionally, by reading out only one color channel per pixel location, two thirds of the required circuitry and wiring can be eliminated from groups in the array in comparison to sensor group 150, thus increasing the fill factor within each pixel location. Increased fill factor results in improved image sensor performance in terms of noise reduction and dynamic range.

FIG. 10 illustrates an array that implements a color filter array pattern that can be switched between two different states. Array 170 is configured to include four VCF sensor groups in two rows and two columns, with each sensor group 172-1 through 172-4 having circuitry for collecting two colors that share a common column output line 174-1 and 174-2. Row selection lines RowA and RowB connect to the gates of selection transistors and control the selection of the sensor group outputs onto the shared column lines. The RowA and RowB lines are connected such that the color filter array pattern can be switched between two different states corresponding to RowA or RowB. In either state, only one color per pixel location is read out, but the color read from the pixel location is determined by which of the row selection lines is used. In the case of FIG. 10, RowA selects blue and green data in the first row, and green and red data in the second row. Using RowB instead of RowA selects green and red in the first row, and blue and green in the second row.

It should be evident from the drawing and explanation of FIG. 10 that the array of sensor groups shown can be part of a larger N×M array of sensor groups, wherein N and M are any desired numbers and the RowA and RowB selection can be controlled by a decoder or other sequencing circuit thereby allowing an array of such sensor groups to switch between color filter array patterns through electronic or software control. Switching of the pattern can be used to increase the resolution in the interpolated image by reading multiple color sub-sampled images that have a different arrangement of the color filter pattern, and subsequently combining these images in processing hardware or software using a suitable image reconstruction algorithm. Additionally, the ability to program the pattern may simplify integration of sensor groups 172-1 through 172-4 with system components that are configured to function with a particular orientation of the color filter array pattern data.

As illustrated in FIGS. 11A–11D, multiple VCF sensor groups 172 can be covered optionally with color filters represented by a large X within the sensor group. The color filters indicated by the X markers can be organic dye filters, dielectric filters, polysilicon filters or other types of color filters. The sensor groups of FIGS. 11A–11D employ the same design as depicted by the circuit in FIG. 10. In FIGS. 11A–11D, the color readout selection capability is depicted by the B/G and G/R indicated at each sensor group location. The B/G indicates a sensor group capable of reading out blue or green, based on the row selection inputs, and the G/R indicates the ability to read out green or red, based on the row selection inputs. In a preferred embodiment depicted in FIG. 11A, color filters are distributed among sensor groups in pairs offset by two pixels per row, and where on alternating rows the color filters are offset from the filters of the previous row by two pixels. This arrangement results in a pattern where all combinations of sensor group and color filter are present.

FIGS. 11B–11D depict other arrangements of color filters with sensor groups of the type shown in FIG. 10, showing the ability arrange the array to read out different colors in different orders and using color filter patterns in conjunction with the different arrangements of sensor groups. In all cases the B/G and R/G notation is used to indicate that by using row selection circuitry, the order of color read out can be chosen.

FIG. 12 illustrates a VCF sensor group 180 wherein in the output signals for each color channel are multiplexed to a single column output line 182. Circuits 184-1 through 184-3 of sensor group 180 are connected to a decoder 186, which activates the individual circuits based on a combination of signals along the two input lines 188-1 and 188-2. For example, sending a zero value on line 188-1 and a zero value on line 188-2 can activate circuit 184-1. Other combinations of the values of zero and one can address circuits 184-2 and 184-3, while a one value on both lines 188-1, 188-2 can activate all circuits 184-1 through 184-3 simultaneously, resulting in a monochrome output. Once the decoder 186 has activated the desired circuits, the sensor output signals are amplified by the source follower 190 and can be selected onto the column output line 182 by row select circuit 192 controlled by row address generator 194.

FIG. 13 illustrates an array 200 of VCF sensor groups 202-1 through 202-4. Array 200 is able to read out two colors per pixel location, by including two column output lines in each sensor group 202-1 through 202-4. Column output lines 201 and 206 connect to both blue and red sensor outputs via the row select transistors, and column output lines 204 and 208 are connected only to green. The column output lines for each column of sensor groups can be selected onto output buses by means of a decoder and switches, one bus corresponding to the red/blue data, and one bus corresponding to the green data. In this embodiment, array 200 is configured in a manner that is similar to a Bayer pattern, but has the additional benefit that there is a green sensor at every pixel location, rather than in only half the locations as is the case in color filter arrays that employ conventional Bayer patterns. This type of array allows for very high resolution and reduced color aliasing artifacts because of the higher sampling rate in the green channel. Additionally, each pixel location requires only six transistors as opposed to nine for a fully accessed array, since one color in each sensor group 202-1 through 202-4 is not collected. The reduced number of transistors allows for an increased fill factor or a reduced pixel size. Both of these benefits may be realized in systems that require smaller higher performance image sensors.

As illustrated in FIGS. 14A and 14B multiple VCF sensor groups 202 can be covered optionally with color filters represented by a large X within the sensor group. The color filters indicated by the X markers can be organic filters, dielectric filters, polysilicon filters or other types of color filters. The sensor groups of FIGS. 14A and 14B employ the same design as that depicted by FIG. 13. The letters within each square are representative of the sensors that are connected to the column output lines of the array so that a VCF sensor group with the label BG has the blue and green sensor outputs connected, through row selection transistors, to the two column output lines that traverse the entire column of VCF sensor groups and a VCF sensor group with the label GR has the green and red sensor outputs connected, through row selection transistors, to the two column output lines that traverse the entire column of sensor groups. In a preferred embodiment indicated by FIGS. 14A and 14B, color filters are distributed among sensor groups in pairs offset by two sensor groups per row, and where on alternating rows the color filters are offset from the filters of the previous row by two sensor groups. This arrangement results in a pattern where all combinations of sensor groups and color filters are present. FIG. 14A illustrates an embodiment where the array of sensor groups begins with a blue/green sensor group, and FIG. 14B illustrates and embodiment where the array of sensor groups begins with a green/red sensor group. In both embodiments, alternate rows begin with a different sensor group combination, thereby alternating the blue/green and red/green sensor groups. It is also possible to create arrays of such sensor groups wherein the first sensor group of each row is of the same type.

FIG. 16 illustrates a schematic for a preferred implementation of an array of VCF sensors of the type shown in FIG. 13. Array 220 of FIG. 16 is one of several ways in which signals can be routed to create an array that uses color sub-sampling in combination with signal summation in two of the color channels, but full sampling in a third channel. In array 220, there are two column output lines per pixel location, but it is possible to use three column output lines per location in the case that better chip layout and routing can be implemented. The pixel circuit shown in FIG. 16 is a simple three-transistor active pixel circuit per color channel, but other pixel circuits can also be used in array 220. In FIG. 16, the output from the green sensor of each sensor group is connected to one of the column output lines that correspond to each column of sensor groups, and the other column output line is connected to the summed output signal from two adjacent blue or red sensors. The arrangement of connections of blue and red sensors is such that whichever of the blue or red is connected first on a given row, the other color will be the first one connected on the following row, making the pattern of blue and red readout locations appear like a checkerboard, with corresponding sensor areas two elements wide and one element high. Those of ordinary skill in the art will recognize that the orientation of the array is arbitrary, and the terms width and height can be interchanged in conjunction with suitable changes to circuitry. In addition, the arrangement of color sensor groups can be altered to form other color filter array patterns or to share column output lines among sensors of different colors than indicated in FIG. 16. FIG. 16 also indicates that the method of connecting the sensors which are shared can be either through the use of wires to form electrical connections between laterally separated sensors (in the same vertical layer) that have identical or similar size (as implied by FIG. 16) or by creating photodetector layers that are of different sizes (as shown in FIG. 13).

Sensor group 10 and sensor group 150, including the above array implementations, can be combined with traditional color filter arrays that employ organic or other types of absorbing or reflecting filters such as dielectric filters or polysilicon filters. Such filters can be placed directly on the image sensor above the plane of the semiconductor substrate as is well known in the art. Various combinations of color filters and VCF sensor groups can be constructed to provide improved photon efficiency, color accuracy, and sensor resolution. For example, an array of VCF sensor groups such as the one depicted in FIG. 9 can be combined with organic color filters of the type typically used in image sensor manufacturing. Color filters could be formed on the device in a checkerboard-like pattern to tune the color response of the sensor groups that are responsive to blue and red illumination. In this case, the filter properties of the color filter could be very simple and much less sensitive to manufacturing variations due to the fact that the color filter works in conjunction with the semiconductor color filter properties. The advantage gained is a potentially more desirable color filter response. Alternatively, the organic, dielectric, or polysilicon filters could be placed on top of the sensor groups in an alternating arrangement such that every other sensor group that responds to a particular color also has a color filter that serves to shape the color response, thereby creating an array with six distinct color responses. This method allows for a large variety of color responses while minimizing the manufacturing overhead associated with the process of placing organic or other types of color filters, such as dielectric filters or polysilicon layers, on top of the image sensor surface.

In a class of embodiments, the inventive array includes VCF sensor groups, each group includes vertically stacked sensors, the sensors include a top sensor having a top surface, and radiation to be sensed is incident at the top surface and propagates into the top sensor (through the top surface) before reaching any other sensor of the group. The top surface defines a normal axis (and is typically at least substantially planar). Preferably, the sensors are configured such that when radiation propagating along a vertical axis of the group (defined above) is incident at the group, the radiation is incident at the top sensor with an incidence angle of less than about 30 degrees with respect to the normal axis.

The expression "minimum-sized" carrier-collection element of a VCF sensor group is used herein to denote each carrier-collection element of the group whose projection, on a plane perpendicular to a normal axis defined by a top surface of a top sensor of the group, has an area that is not greater than the projected area of each other carrier-collection element of the group on such plane. The expression "minimum collection area" (of a group) is used herein to denote the projected area of a minimum-sized carrier-collection element of the group, on a plane perpendicular to a normal axis defined by a top surface of a top sensor of the group. In a class of embodiments of the inventive sensor group array, the carrier-collection element of one sensor of each group has substantially larger "size" (area projected in a plane perpendicular to a normal axis of a top surface of a top sensor of the group) than does each minimum-sized carrier-collection element of the group, as in the sensor groups of FIGS. 15, 16, and 17. In some preferred embodiments in this class, one carrier-collection element of a sensor group has size that is at least twice the group's minimum collection area. This carrier-collection element is shared by at least one other sensor group of the array, and its size is typically at least substantially equal to the sum of the sizes of all the groups that share it.

The array of FIG. 15 includes a plurality of sensor groups, six of which are shown in FIG. 15. Each sensor group includes one green sensor (whose carrier-collection area is not shared with any other sensor group), one blue sensor (shared with one other sensor group), and one red sensor (shared with one other sensor group. The carrier-collection area of each red sensor and each blue sensor is shared by two sensor groups. The carrier-collection areas for blue and red photons are larger than the collection areas for green photons.

In variations on the FIG. 15 or 18 array, at least one carrier-collection area (shared by two sensor groups) comprises two or more portions that are initially formed to be laterally separated from each other and are then shorted together to form a single effective carrier-collection area. For example, each blue sensor can include two laterally separated carrier-collection areas for blue photons, each formed over a different carrier-collection area for green photons, with the two carrier-collection areas for blue photons being laterally separated to provide space for forming at least one transistor on the array's top surface therebetween. The two laterally separated carrier-collection areas of each blue sensor are shorted together to form a single effective carrier-collection area for blue photons that has larger total size than each of the array's carrier-collection areas for green photons.

With reference again to FIG. 15, the electric charge collected on each red sensor is converted to an electrical signal indicative of twice the average of the incident red intensity at the two sensor groups which share the red sensor. The electric charge collected on each blue sensor is converted to an electrical signal indicative of twice the average of the incident blue intensity at the two sensor groups which share the blue sensor. Thus, the array's resolution with respect to green light is twice its resolution with respect to red or blue light. This type of array increases the signal to noise ratio in the blue and red channels while maintaining high spatial resolution in a green (or luminance-like) channel. The high luminance resolution is achieved because every pixel location has an active green sensor, in contrast with conventional image sensor arrays using the Bayer pattern that have a green sensor at only half of the pixel locations. Those of ordinary skill in the art will recognize that maintaining high luminance resolution via a higher sampling rate in the green channel will reduce the presence of aliasing artifacts in interpolated images generated with such an array. Larger blue and red carrier-collection areas further reduce the presence of aliasing artifacts.

In other embodiments, the carrier-collecting areas of the blue sensors of an array of VCF sensor groups are smaller than the carrier-collecting areas of the red and green sensors of the array.

In some embodiments of an array of VCF sensor groups, one sensor group includes at least one sensor (or element of a sensor) that is shared with another sensor group. FIG. 17 is a cross-sectional view (in a vertical plane) of such an array. In FIG. 17, a first sensor group comprises a first sensor which in turn comprises layer 102 (made of n-type semiconductor) and the regions of p-type material 100 immediately above and below layer 102, and a second sensor which in turn comprises layer 101 (made of n-type semiconductor) and the regions of p-type material 100 immediately above and below layer 101. FIG. 17 also shows a second sensor group comprising a third sensor (which in turn comprises layer 103 made of n-type semiconductor and the regions of p-type material 100 immediately above and below layer 103) and the second sensor. Thus, the second sensor (which includes layer 101) is shared by the two sensor groups, and each of the separate first and third sensors is positioned at the same vertical level in the array.

The FIG. 17 array could be configured so that the first sensor's output is indicative of a blue component of a first pixel, the third sensor's output is indicative of a blue component of a second pixel, and the second sensor's output is indicative of a green component of both the first pixel and the second pixel. The FIG. 17 array is preferably operable in a mode in which it has better resolution with respect to green light than blue light (e.g., by using the outputs of the first, second, and third sensors separately), and in another mode in which it has equal resolution with respect to blue light and green light (e.g., by averaging the outputs of the first and third sensors, and using this averaged value with the output of the second sensor). The FIG. 17 array is a simple embodiment with sensors at only two depths. The sensor groups of other embodiments of the inventive array have sensors arranged vertically at three or more different depths.

In the VCF sensor group array of FIG. 18, the carrier-collection elements of the red and blue sensors of each sensor group have larger size than does the carrier-collection element of the group's green sensor. The array of FIG. 18 includes a plurality of sensor groups, four of which are shown in FIG. 18. Each sensor group includes one green sensor whose carrier-collection area (182, 183, 184, or 185) is not shared with any other sensor group, one blue sensor whose carrier-collection area (180) is shared with each of three other sensor groups, and one red sensor whose carrier-collection area (181) is shared with each of three other sensor groups. The carrier-collection areas for blue and red photons are larger than the collection areas for green photons. The electric charge collected on each red sensor (due to photon absorption) is converted to an electrical signal (typically a voltage) indicative of the average of the incident red intensity at the four sensor groups that share the red sensor. The electric charge collected on each blue sensor is converted to an electrical signal (typically a voltage) indicative of the average of the incident blue intensity at the four sensor groups that share the blue sensor. Typically, voltage outputs of the red and blue sensors of the FIG. 18 array (and variations on such array) do not need to be scaled relative to voltage outputs of the green sensors, since the increase in the electric charge collected on each sensor due to an increase in the sensor's carrier-collection area is proportional to the increase in the sensor's capacitance due to such carrier-collection area increase.

When fabricating an array of VCF sensor groups so that the output of each sensor group determines a pixel, it is necessary to isolate the sensor groups from each other to avoid cross talk between pixels. If electrons and holes created in one sensor group can drift into another, the resolution of the imager will be reduced. In preferred embodiments of the invention, such isolation is accomplished by fabricating sensor groups whose physical design contains the charge generated within them. For example, with reference again to FIG. 17, in the array of FIG. 17 the lower and larger "second sensor" (including layer 101) is isolated from its neighbor (partially shown but not labeled) at the same vertical level by an n-p substrate junction just as the smaller "first" and "third" sensors (including layers 102 and 103 respectively) are isolated from each other by an n-p substrate junction.

It is contemplated that some embodiments of the inventive sensor group array will be implemented in accordance with the teachings of (e.g., using the fabrication techniques described in) one or both of the parent applications (U.S. application Ser. No. 10/355,723, and U.S. application Ser. No. 10/103,304).

FIG. 19 is an example of a Bayer pattern which can be implemented by a conventional array of single-layer sensors. The Bayer pattern is a mosaic (i.e., a "tessellation") of blocks, each block (e.g., the four sensors in the upper left corner of FIG. 19) consisting of four single-layer sensors: one red sensor and one blue sensor (diagonally offset from each other) and two green sensors (also diagonally offset from each other). The block consisting of the four sensors in the upper left corner of FIG. 19 includes red sensor "R2" and blue sensor "B6" (diagonally offset from each other) and green sensors "G1" and "G7" (diagonally offset from each other).

FIG. 20 is a top view of an array of VCF sensor groups that emulates the Bayer pattern of FIG. 19, but does not utilize the output of each sensor of each of its sensor groups. In FIG. 20, each VCF sensor group includes a blue sensor 90 (the top sensor of the sensor group), a green sensor 91 below the blue sensor, and a red sensor 92 below the green sensor. The four sensor groups in the upper left corner of FIG. 20 are labeled as groups A, B, C, and D, respectively. Sensor groups A and B belong to the first row of the array, and sensors C and D belong to the second row of the array. FIG. 20 indicates that the blue sensors of groups A, B, and D are grounded (rather than being coupled to readout circuitry) so that the outputs of these sensors are not used. The output of one blue sensor (sensor 90 of group C) emulates blue sensor B6 of the Bayer pattern. FIG. 20 indicates that the red sensors of groups A, C, and D are grounded (rather than being coupled to readout circuitry) so that the outputs of these sensors are not used. The output of one red sensor (sensor 92 of group B) emulates red sensor R2 of the Bayer pattern. Note that sensor 90 of group C and sensor 92 of group B are diagonally offset from each other.

FIG. 20 indicates that the green sensors of groups B and C are grounded (rather than being coupled to readout circuitry) so that the outputs of these sensors are not used. The output of green sensor 91 of group A emulates green sensor G1 of the Bayer pattern, and the output of green sensor 91 of group D emulates green sensor G7 of the Bayer pattern. Note that sensors 91 of groups A and D are diagonally offset from each other.

FIG. 21 is a top view of an array of rows and columns of VCF sensor groups that embodies the invention and emulates a Bayer pattern. The FIG. 21 array is more efficient than the FIG. 20 array because it utilizes the output of each sensor of each of its sensor groups. In FIG. 21, each VCF sensor group includes a blue sensor 95 (the top sensor of the sensor group), a green sensor 96 below the blue sensor, and a red sensor 97 below the green sensor. The outputs of blocks of four red sensors 97 are combined, the outputs of blocks of four blue sensors 95 are combined, and the outputs of diagonally offset pairs of two green sensors 96 are combined. The combined output of one such block of red sensors 97 emulates the output of a red sensor of the Bayer pattern, the combined output of a corresponding block of blue sensors 95 (such block of blue sensors having a center that is diagonally offset from the center of the corresponding block of red sensors) emulates the output of a blue sensor of the Bayer pattern, the combined output of one pair of green sensors 96 emulates the output of one green sensor of the Bayer pattern, and the combined output of another pair of the green sensors 96 emulates the output of another green sensor of the Bayer pattern.

For example, consider the nine sensor groups whose centers are arranged around the periphery of square 100 of FIG. 21. These sensor groups are shown in FIG. 22, with the upper left sensor group of FIG. 22 (whose sensors are labeled 95A, 96A, and 97A) corresponding to the upper left sensor group of FIG. 21. The outputs of sensors of these nine sensor groups are combined to emulate sensors G1, R2, B6, and G7 of the Bayer pattern of FIG. 19. Specifically, the combined outputs of red sensors 97A, 97B, 97D, and 97E of the four sensor groups in the upper left of FIG. 22 emulate the output of red sensor R2 of the Bayer pattern. As shown, the outputs of these four red sensors are combined in the sense that metal strips 101 connect them, and readout circuitry (not shown) is or can be coupled to any of sensors 97A, 97B, 97D, and 97E and strips 101. The combined outputs of blue sensors 95E, 95F, 95H, and 95I of the four sensor groups in the lower right of FIG. 22 emulate the output of blue sensor B6 of the Bayer pattern. As shown, the outputs of these four blue sensors are combined in the sense that metal strips 102 connect them, and readout circuitry (not shown) is or can be coupled to any of sensors 95E, 95F, 95H, and 95I and strips 102. The combined outputs of green sensors 96B and 96F (of diagonally offset sensor groups) of FIG. 22 emulate the output of green sensor G1 of the Bayer pattern, and combined outputs of green sensors 96E and 96G (of two other diagonally offset sensor groups) of FIG. 22 emulate the output of green sensor G7 of the Bayer pattern. As shown, the outputs of green sensors 96B and 96F are combined in the sense that a metal strip 103 connects them, and readout circuitry (not shown) is or can be coupled to any of sensors 96B and 96F and this strip 103. The outputs of green sensors 96E and 96G are combined in the sense that another metal strip 103 connects them, and readout circuitry (not shown) is or can be coupled to any of sensors 96E and 96G and this strip 103.

It will be appreciated that aliasing can occur during use of the FIG. 20 array, and that it is conventional to avoid such aliasing by blurring the incoming image to remove spatial frequencies greater than the array's sampling frequency. An advantage of the FIG. 21 array is that, when the FIG. 20 and 21 arrays are exposed to identical radiation, the FIG. 21 array does not cause aliasing that would be caused by the FIG. 20 array. The structure of the FIG. 21 array thus eliminates the need to blur the incoming image to prevent aliasing, although such image blurring would be needed to prevent aliasing during use of the FIG. 20 array.

Next, with reference to FIG. 23, we describe a variation on the array of FIG. 22 (or FIG. 24) in which the outputs of the red sensors of blocks of four sensor groups are combined in a different manner than in FIG. 22. FIG. 23 is a top view of four sensor groups in the upper left corner of this variation on the FIG. 21 array. The sensor groups of FIG. 23 correspond to the sensor groups in the upper left corner of FIG. 22. In FIG. 23, red sensor 197A is shared by all four of the sensor groups shown (in the sense that a single carrier-collection element at the "red" layer of the group is shared by all four of the sensor groups). The output of sensor 197A (which is considered to be the combined red sensor output of the four sensor groups of FIG. 23) emulates the output of red sensor R2 of the Bayer pattern.

Each of the four sensor groups of FIG. 23 includes its own blue sensor (one of sensors 95A, 95B, 95D, and 95E), implemented (typically near the top surface of a semiconductor wafer) at a layer above the layer at which red sensor 197A is implemented. Each of the four sensor groups of FIG. 23 includes its own green sensor (one of sensors 96A, 96B, 95D, and 95E), implemented at a layer between the layers at which the red and blue sensors are implemented.

In a variation on the FIG. 23 array, green sensors (as well as red sensors) are shared by multiple sensor groups. For example, the carrier-collection element of each green sensor is an oblong area shared by two diagonally offset sensor groups, such oblong area having size about half the size of the carrier-collection element of red sensor 197A. In this example, the output of one green sensor (shared by two diagonally offset sensor groups) emulates one green component of a block of the Bayer pattern, and the output of another green sensor (shared by two other diagonally offset sensor groups) emulates the other green component of such block of the Bayer pattern.

FIG. 25 is a top view of four sensor groups of another VCF sensor group array that can embody the invention. In FIG. 25, green sensor 106A is shared by two diagonally offset ones of the sensor groups (in the sense that a single carrier-collection element at the "green" layer of the array is an oblong area shared by the two sensor groups, and the output of sensor 106A can be used as the combined green sensor output of those two sensor groups). Each of the four sensor groups of FIG. 25 also includes its own blue sensor (one of sensors 105A, 105B, 105D, and 105E) at a "blue" layer of the array and its own red sensor (one of sensors 107A, 107B, 107D, and 107E) at a "red" layer of the array.

FIG. 24 is a top view of nine sensor groups of an array that embodies the invention. Each of the sensor groups of FIG. 24 is identical to a corresponding one of the sensor groups of FIG. 22, but the FIG. 24 array includes no conductors connected directly between sensors of different ones of the sensor groups. FIG. 24 also shows a portion of the readout circuitry that is coupled to the sensors of the array to accomplish selective combination of the outputs of the sensors in accordance with the invention, and to read out each of the sensors. Only some of the readout circuitry (i.e., only a portion of the readout circuitry that is coupled to blue sensors 95A, 95B, 95D, and 95E) is shown for clarity. The output of each individual one of sensors 95A, 95B, 95D, and 95E is asserted directly (via a separate line) to a different input of multiplexer 110. The outputs of sensors 95A, 95B, 95D, and 95E are combined at Node N by connecting together lines readout coupled to each of these sensors, and the combined output is asserted to a fifth input of multiplexer 110. In response to a control signal (which selects an operating mode, and state, of the array), multiplexer 110 passes through (as the "Output" signal) the sensor signal at any selected one of its inputs. In a state which the array emulates the Bayer pattern of FIG. 19, the Output signal is indicative of the combined outputs of 95A, 95B, 95D, and 95E. The Output signal is asserted from multiplexer 110 to other elements (not shown) of the readout circuitry. Additional readout circuitry (not shown) would by employed to read out the other sensors individually (in a first state), and to read out the combined outputs of subsets of the sensors (in a different state).

While best modes for implementing the present invention and applications of the invention have been described herein, it will be apparent to those of ordinary skill in the art that many variations on the embodiments and applications described herein are possible without departing from the scope of the invention described and claimed herein. For example, some embodiments of the inventive array emulate an array of single-layer sensors arranged in a single-layer sensor pattern that is a Bayer pattern, and other embodiments of the inventive array emulate an array of single-layer sensors arranged in a single-layer sensor pattern other than a Bayer pattern. It should be understood that while certain forms of the invention have been shown and described, the invention is not to be limited to the specific embodiments described and shown or the specific methods described. Further, the claims that describe methods do not imply any specific order of steps unless explicitly described in the claim language.

What is claimed is:

1. An array of vertical color filter sensor groups, each of the sensor groups including at least two vertically stacked, photosensitive sensors, wherein the sensor groups are configured such that outputs of sensors of at least some of the sensor groups are combined such that the array emulates an array of single-layer sensors arranged in a single-layer sensor pattern, and such that the outputs of all of the sensors of each of at least substantially all of the sensor groups are utilized to emulate the array of single-layer sensors.

2. The array of claim 1, wherein the single-layer sensor pattern is a Bayer pattern.

3. The array of claim 2, wherein the sensor groups are configured such that the outputs of all of the sensors of each of the sensor groups are utilized to emulate the array of single-layer sensors.

4. The array of claim 1, wherein the sensor groups are configured such that the outputs of all of the sensors of each of the sensor groups are utilized to emulate the array of single-layer sensors.

5. The array of claim 1, including:
   electrically conductive material that couples together at least two of the sensors whose outputs are combined, wherein each of said at least two of the sensors is an element of a different one of the sensor groups.

6. The array of claim 1, wherein at least one of the sensors of at least one of the sensor groups is a shared sensor, the shared sensor is shared with at least one other one of the sensor groups, and the shared sensor has an output that is utilized to emulate the array of single-layer sensors.

7. The array of claim 1, wherein sensors of the sensor groups are arranged in vertically-stacked layers including at least a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

8. The array of claim 1, wherein each of the sensor groups comprises:
at least two vertically stacked sensors including a top sensor having a top surface that defines a normal axis, wherein each of the sensors has a different spectral response, is configured to be biased to function as a photodiode, and has a carrier-collection element configured to collect photo-generated carriers when the sensors are biased to function as photodiodes, wherein at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element.

9. The array of claim 1, wherein the sensors of each of the sensor groups include:
a top, blue-sensitive sensor;
a bottom, red-sensitive sensor; and
a green-sensitive sensor between the blue-sensitive sensor and the red-sensitive sensor.

10. An array of vertical color filter sensor groups, each of the sensor groups including at least two vertically stacked, photosensitive sensors, wherein the sensor groups are configured such that outputs of sensors of at least some of the sensor groups are combined such that the array emulates an array of single-layer sensors arranged in a single-layer sensor pattern, and each of the sensor groups comprises:
at least two vertically stacked sensors including a top sensor having a top surface that defines a normal axis, wherein each of the sensors is configured to be biased to function as a photodiode and has a carrier-collection element configured to collect photo-generated carriers when the sensors are biased to function as photodiodes, wherein at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element.

11. The array of claim 10, wherein the single-layer sensor pattern is a Bayer pattern.

12. The array of claim 10, wherein the sensor groups are configured such that the outputs of all of the sensors of each of the sensor groups are utilized to emulate the array of single-layer sensors.

13. The array of claim 10, including:
electrically conductive material that couples together at least two of the sensors whose outputs are combined, wherein each of said at least two of the sensors is an element of a different one of the sensor groups.

14. The array of claim 10, wherein at least one of the sensors of at least one of the sensor groups is a shared sensor, the shared sensor is shared with at least one other one of the sensor groups, and the shared sensor has an output that is utilized to emulate the array of single-layer sensors.

15. The array of claim 10, wherein sensors of the sensor groups are arranged in vertically-stacked layers including at least a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

16. A sensor group array, comprising:
vertical color filter sensor groups, each of the sensor groups including at least two vertically stacked, photosensitive sensors; and
readout circuitry coupled to the sensor groups, wherein the readout circuitry is configured to combine outputs of sensors of at least some of the sensor groups such that the array emulates an array of single-layer sensors arranged in a single-layer sensor pattern, and the readout circuitry is configured to utilize outputs of all of the sensors of each of at least substantially all of the sensor groups to emulate the array of single-layer sensors.

17. The array of claim 16, wherein the single-layer sensor pattern is a Bayer pattern.

18. The array of claim 17, wherein the readout circuitry and the sensor groups are configured such that the outputs of all of the sensors of each of the sensor groups are utilized to emulate the array of single-layer sensors.

19. The array of claim 16, wherein the readout circuitry and the sensor groups are configured such that the outputs of all of the sensors of each of the sensor groups are utilized to emulate the array of single-layer sensors.

20. The array of claim 16, wherein sensors of the sensor groups are arranged in vertically-stacked layers including at least a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

21. The array of claim 20, wherein the sensor groups are configured such that the outputs of all of the sensors of each of the sensor groups are utilized to emulate the array of single-layer sensors.

22. The array of claim 16, wherein the sensors of each of the sensor groups include:
a top, blue-sensitive sensor;
a bottom, red-sensitive sensor; and
a green-sensitive sensor between the blue-sensitive sensor and the red-sensitive sensor.

23. A sensor group array, comprising:
vertical color filter sensor groups, each of the sensor groups including at least two vertically stacked, photosensitive sensors; and
readout circuitry coupled to the sensor groups, wherein the readout circuitry has a state in which it is configured to combine outputs of sensors of at least some of the sensor groups such that the array emulates an array of single-layer sensors arranged in a single-layer sensor pattern, and wherein the readout circuitry in said state is configured to utilize outputs of all of the sensors of each of at least substantially all of the sensor groups to emulate the array of single-layer sensors.

24. The array of claim 23, wherein the single-layer sensor pattern is a Bayer pattern.

25. The array of claim 24, wherein the readout circuitry and the sensor groups are configured such that the outputs of all of the sensors of each of the sensor groups are utilized to emulate the array of single-layer sensors.

26. The array of claim 23, wherein the readout circuitry and the sensor groups are configured such that the outputs of all of the sensors of each of the sensor groups are utilized to emulate the array of single-layer sensors.

27. The array of claim 23, wherein sensors of the sensor groups are arranged in vertically-stacked layers including at least a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

28. The array of claim 27, wherein the sensor groups are configured such that the outputs of all of the sensors of each of the sensor groups are utilized to emulate the array of single-layer sensors.

29. The array of claim 23, wherein the sensors of each of the sensor groups include:
a top, blue-sensitive sensor;
a bottom, red-sensitive sensor; and
a green-sensitive sensor between the blue-sensitive sensor and the red-sensitive sensor.

30. An array of vertical color filter sensor groups, each of the sensor groups including at least three vertically stacked, photosensitive sensors, wherein sensors of the sensor groups are arranged in at least three vertically-stacked layers, and
wherein the sensor groups are configured such that outputs of sensors of at least some of the sensor groups are combined such that the array emulates an array of single-layer sensors arranged in a single-layer sensor pattern, and such that the outputs of all of the sensors in at least three of the layers of each of at least substantially all of the sensor groups are utilized to emulate the array of single-layer sensors.

31. The array of claim 30, wherein the single-layer sensor pattern is a Bayer pattern.

32. The array of claim 30, wherein the sensor groups are configured such that the outputs of all of the sensors in three layers of each of the sensor groups are utilized to emulate the array of single-layer sensors.

33. The array of claim 30, including:
electrically conductive material that couples together at least two of the sensors whose outputs are combined, wherein each of said at least two of the sensors is an element of a different one of the sensor groups.

34. The array of claim 30, wherein at least one of the sensors of at least one of the sensor groups is a shared sensor, the shared sensor is shared with at least one other one of the sensor groups, and the shared sensor has an output that is utilized to emulate the array of single-layer sensors.

35. The array of claim 30, wherein the layers include a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

36. The array of claim 30, wherein each of the sensor groups comprises:
three vertically stacked sensors including a top sensor having a top surface that defines a normal axis, wherein each of the sensors has a different spectral response, is configured to be biased to function as a photodiode, and has a carrier-collection element configured to collect photo-generated carriers when the sensors are biased to function as photodiodes, wherein at least one said carrier-collection element is a minimum-sized carrier-collection element, and the carrier-collection element of at least one of the sensors has an area, projected on a plane perpendicular to the normal axis, that is substantially larger than the area, projected on said plane, of each said minimum-sized carrier-collection element.

37. The array of claim 30, wherein the sensors of each of the sensor groups include:
a top, blue-sensitive sensor;
a bottom, red-sensitive sensor; and
a green-sensitive sensor between the blue-sensitive sensor and the red-sensitive sensor.

38. A sensor group array, comprising:
vertical color filter sensor groups, each of the sensor groups including three vertically stacked, photosensitive sensors, wherein sensors of the sensor groups are arranged in three vertically-stacked layers; and
readout circuitry coupled to the sensor groups, wherein the readout circuitry is configured to combine outputs of sensors of at least some of the sensor groups such that the array emulates an array of single-layer sensors arranged in a single-layer sensor pattern, and wherein the readout circuitry is configured to utilize outputs of all of the sensors in three of the layers of each of at least substantially all of the sensor groups to emulate the array of single-layer sensors.

39. The array of claim 38, wherein the single-layer sensor pattern is a Bayer pattern.

40. The array of claim 38, wherein the readout circuitry and the sensor groups are configured such that the outputs of all of the sensors in three layers of each of the sensor groups are utilized to emulate the array of single-layer sensors.

41. The array of claim 38, wherein the layers include a first layer and a second layer, the first layer defines a mosaic of first subsets of the sensors, outputs of the sensors in each of the first subsets are combined, the second layer defines a mosaic of second subsets of the sensors, outputs of the sensors in each of the second subsets are combined, the first subsets have laterally separated centers, and each of the second subsets has a center that is offset laterally from each of the centers of the first subsets.

42. The array of claim 41, wherein the sensor groups are configured such that the outputs of all of the sensors of each of the sensor groups are utilized to emulate the array of single-layer sensors.

43. The array of claim 38, wherein the sensors of each of the sensor groups include:
a top, blue-sensitive sensor;
a bottom, red-sensitive sensor; and
a green-sensitive sensor between the blue-sensitive sensor and the red-sensitive sensor.

* * * * *